(12) United States Patent
Lee et al.

(10) Patent No.: US 11,678,502 B2
(45) Date of Patent: Jun. 13, 2023

(54) DISPLAY DEVICE HAVING IMPROVED BONDING BETWEEN DISPLAY PANEL AND ENCAPSULATION SUBSTRATE AND METHOD OF FABRICATING THE SAME

(71) Applicant: Samsung Display Co., LTD., Yongin-si (KR)

(72) Inventors: Hyun A Lee, Seoul (KR); Kyung Rok Ko, Suwon-si (KR); Yong Hoon Kwon, Suwon-si (KR); Byung Hoon Kim, Hwaseong-si (KR); Jung Hyun Kim, Suwon-si (KR); Tae Oh Kim, Hwaseong-si (KR); June Hyoung Park, Seoul (KR); Hyun Ji Lee, Gimhae-si (KR); So Mi Jung, Busan (KR)

(73) Assignee: SAMSUNG DISPLAY CO., LTD., Gyenonggi-Do (KR)

( * ) Notice: Subject to any disclaimer, the term of this patent is extended or adjusted under 35 U.S.C. 154(b) by 243 days.

(21) Appl. No.: 17/012,115

(22) Filed: Sep. 4, 2020

(65) Prior Publication Data
US 2021/0249627 A1 Aug. 12, 2021

(30) Foreign Application Priority Data
Feb. 10, 2020 (KR) .................. 10-2020-0015461

(51) Int. Cl.
*H01L 51/52* (2006.01)
*H01L 27/32* (2006.01)
*H01L 23/00* (2006.01)

(52) U.S. Cl.
CPC .......... *H01L 51/5246* (2013.01); *H01L 24/05* (2013.01); *H01L 24/06* (2013.01);
(Continued)

(58) Field of Classification Search
CPC . H01L 51/5246; H01L 24/06; H01L 27/3276; H01L 27/3258; H01L 2224/0557
(Continued)

(56) References Cited

U.S. PATENT DOCUMENTS 5,489,321 A * 2/1996 Tracy ..................... C03C 27/06
156/99
6,201,346 B1 * 3/2001 Kusaka ............... H01L 27/3288
313/506
(Continued)

FOREIGN PATENT DOCUMENTS

KR 1020130142750 A 12/2013
KR 1020140122595 A 10/2014
(Continued)

*Primary Examiner* — Thao X Le
*Assistant Examiner* — Laura M Dykes
(74) *Attorney, Agent, or Firm* — Cantor Colburn LLP

(57) ABSTRACT

A display device includes a display panel having a display area comprising pixels and a non-display area surrounding the display area, an encapsulation substrate which faces the display panel and is disposed on a surface of the display panel, and a sealing member disposed in the non-display area and interposed between the display panel and the encapsulation substrate for bonding. The display panel comprises a base substrate and a first conductive layer disposed on a first surface of the base substrate, the base substrate provides a through hole defined in a part of the non-display area to penetrate the base substrate in a thickness direction, the first conductive layer comprises a signal line disposed in a part of the non-display area and filling the through hole, and the sealing member does not overlap the first conductive layer and the through hole in the thickness direction.

18 Claims, 21 Drawing Sheets

(52) U.S. Cl.
CPC ............. *H01L 24/16* (2013.01); *H01L 24/17* (2013.01); *H01L 27/3276* (2013.01); *H01L 27/3258* (2013.01); *H01L 2224/0557* (2013.01); *H01L 2224/06154* (2013.01); *H01L 2224/16145* (2013.01); *H01L 2224/17154* (2013.01)

(58) Field of Classification Search
USPC .......................................................... 257/88
See application file for complete search history.

(56) References Cited

U.S. PATENT DOCUMENTS

| | | | |
|---|---|---|---|
| 6,690,032 B1* | 2/2004 | Umetsu ................ | G02F 1/1345 257/621 |
| 2006/0125995 A1* | 6/2006 | Tai ..................... | G02F 1/13452 349/151 |
| 2014/0306192 A1 | 10/2014 | Han | |
| 2016/0336532 A1* | 11/2016 | Li ........................ | H01L 25/167 |
| 2019/0047251 A1* | 2/2019 | Song ........................ | B32B 9/04 |

FOREIGN PATENT DOCUMENTS

| | | |
|---|---|---|
| KR | 1020170071659 A | 6/2017 |
| KR | 1020190055860 A | 5/2019 |
| KR | 102069810 B1 | 1/2020 |

\* cited by examiner

DISPLAY DEVICE HAVING IMPROVED BONDING BETWEEN DISPLAY PANEL AND ENCAPSULATION SUBSTRATE AND METHOD OF FABRICATING THE SAME

This application claims priority to Korean Patent Application No. 10-2020-0015461, filed on Feb. 10, 2020, and all the benefits accruing therefrom under 35 U.S.C. § 119, the content of which in its entirety is herein incorporated by reference.

BACKGROUND

1. Field

The present disclosure relates to a display device and a method of fabricating the same.

2. Description of the Related Art

A display device is becoming increasingly important with the development of multimedia. Accordingly, various types of display devices such as organic light emitting displays and liquid crystal displays are being used.

The display device is a device for displaying an image and includes a display panel such as an organic light emitting display panel or a liquid crystal display panel. As a light emitting display panel, the display panel may include light emitting elements such as light emitting diodes ("LEDs"). For example, the LEDs may be organic light emitting diodes ("OLEDs") using an organic material as a fluorescent material or may be inorganic LEDs using an inorganic material as the fluorescent material.

SUMMARY

Aspects of the present disclosure provide a display device and a method of fabricating the same, in which adhesion of a sealing member bonding a display panel and an encapsulation substrate together is improved.

Aspects of the present disclosure also provide a display device and a method of fabricating the same, in which a conductive layer provided in a non-display area of a display panel including a display area and the non-display area is prevented from being damaged.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a display panel which includes a display area including pixels and a non-display area surrounding the display area; an encapsulation substrate which faces the display panel and is disposed on a surface of the display panel; and a sealing member disposed in the non-display area and interposed between the display panel and the encapsulation substrate to bond the display panel and the encapsulation substrate together, where the display panel includes a base substrate and a first conductive layer disposed on a surface of the base substrate, the base substrate provides a through hole defined in at least a part of the non-display area to penetrate the base substrate in a thickness direction, the first conductive layer includes a signal line disposed in at least a part of the non-display area and filling the through hole, and the sealing member does not overlap the first conductive layer and the through hole in the thickness direction.

In an exemplary embodiment, a fusion area in which no physical boundary may exist between the base substrate, the encapsulation substrate and the sealing member is disposed in the non-display area, and the fusion area may be disposed across the base substrate, the sealing member and the encapsulation substrate.

In an exemplary embodiment, a contact surface between the base substrate and the sealing member may partially have a physical boundary, and a contact surface between the encapsulation substrate and the sealing member may partially have a physical boundary.

In an exemplary embodiment, the fusion area may not overlap the signal line.

In an exemplary embodiment, a height of the fusion area may be greater than a thickness of the sealing member in the thickness direction.

In an exemplary embodiment, a plasma structure having a long axis and a short axis may be included in the fusion area, and the plasma structure may be disposed across the base substrate, the sealing member and the encapsulation substrate.

In an exemplary embodiment, the plasma structure may not overlap the signal line.

In an exemplary embodiment, the display device may further include a display driving circuit disposed on a second surface opposite to the first surface of the base substrate to overlap the sealing member in the thickness direction.

In an exemplary embodiment, the display panel may include a second conductive layer disposed between the base substrate and the display driving circuit and which does not overlap the sealing member in the thickness direction, and the second conductive layer may include a display pad overlapping the through hole in the thickness direction.

In an exemplary embodiment, the display driving circuit may be electrically connected to the signal line through the through hole and the display pad.

In an exemplary embodiment, the display device may further include a display circuit board disposed in the non-display area and disposed on the first surface of the base substrate.

In an exemplary embodiment, the signal line may include a first signal line electrically connecting the display driving circuit and the pixels of the display panel and a second signal line electrically connecting the display driving circuit and the display circuit board.

In an exemplary embodiment, a width of the sealing member may be smaller than a width of the display driving circuit.

According to an aspect of the present disclosure, a display device includes a first substrate which includes a plurality of light emitting elements, a base substrate comprising a display area having the light emitting elements and a non-display area surrounding the display area, a first conductive layer disposed on a first surface of the non-display area of the base substrate, and a second conductive layer disposed on a second surface opposite to the first surface of the non-display area of the base substrate, a second substrate disposed on a first surface of the first substrate, a sealing member disposed between the first substrate and the second substrate, disposed in the non-display area with a closed loop shape to surround the display area, and disposed not to overlap the first conductive layer and the second conductive layer in a thickness direction; and a display driving circuit which is disposed on a second surface opposite to the first surface of the first substrate and covers the second conductive layer and the sealing member, where a first through hole which penetrates the base substrate in the thickness direction is defined in the non-display area of the base substrate inside an area outlined by the sealing member, a second through hole which penetrates the base substrate in the thickness direction is defined outside the area outlined by the sealing member, the second conductive layer includes a first display pad overlapping the first through hole and a second display pad overlapping the second through hole, and the first conductive layer includes a first signal line electrically connected to the first display pad through the first through hole and a second signal line electrically connected to the second display pad through the second through hole.

In an exemplary embodiment, the display driving circuit may be electrically connected to the first signal line through the first display pad and electrically connected to the second signal line through the second display pad.

In an exemplary embodiment, a width of the display driving circuit may be greater than a width of the sealing member, and a distance between the first display pad and the second display pad may be greater than the width of the sealing member.

In an exemplary embodiment, a fusion area in which no physical boundary may exist between the first substrate, the second substrate and the sealing member may be disposed in the non-display area, and the fusion area may be disposed across the first substrate, the sealing member and the second substrate.

In an exemplary embodiment, the fusion area may not overlap the first signal line, the second signal line, the first display pad, and the second display pad.

According to an embodiment of the present disclosure, a method of fabricating a display device includes preparing a first substrate which includes a display area and a non-display area surrounding the display area and includes a conductive layer and a through hole in at least a part of the non-display area, placing a second substrate and a sealing member on the first substrate such that the second substrate is disposed on the first substrate to face the first substrate and the sealing member is interposed between the first substrate and the second substrate, and bonding the first substrate, the sealing member and the second substrate together by irradiating laser beam to the sealing member, where the sealing member does not overlap the conductive layer and the through hole in a thickness direction.

In an exemplary embodiment, the bonding of the first substrate, the sealing member and the second substrate together by irradiating the laser beam to the sealing member may include: setting a focus in the sealing member; and forming a fusion area in which no physical boundary exists between the first substrate, the sealing member and the second substrate by irradiating the laser beam to the focus, where the fusion area does not overlap the conductive layer and the through hole.

In a display device and a method of fabricating the same according to an embodiment, a sealing member may be disposed between a display panel including a display area and a non-display area and an encapsulation substrate, and a fusion area where heat is diffused under the influence of thermal energy generated by laser irradiation and where no physical boundary exists may be formed between the display panel, the sealing member and the encapsulation substrate. The display panel may include a conductive layer formed in the non-display area of the display panel, and the sealing member may be disposed not to overlap the conductive layer formed in the non-display area of the display panel. Thus, the fusion area may be formed not to overlap the conductive layer. Therefore, even though a focus to which laser light is irradiated is formed inside the sealing member, the conductive layer of the display panel can be prevented from being damaged by the thermal energy (or the fusion area) because the fusion area is formed not to overlap the conductive layer of the display panel.

In addition, since the display device according to the embodiment includes the fusion area including materials that form the sealing member and the encapsulation substrate or the display panel are fused at a boundary between the sealing member and the encapsulation substrate or the display panel, durability against external impact can be improved. The sealing member directly contacts the display panel and the encapsulation substrate to bond them together, and at the same time, the fusion area is formed in the sealing member. Thus, the adhesion of the sealing member to the encapsulation substrate can be further improved.

In addition, in the display device according to the embodiment, a display driving circuit is disposed on a lower surface of the display panel to overlap the sealing member. Therefore, a dead space of the display device can be reduced.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and willfully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, embodiments will be described with reference to the accompanying drawings.

Figure 1:
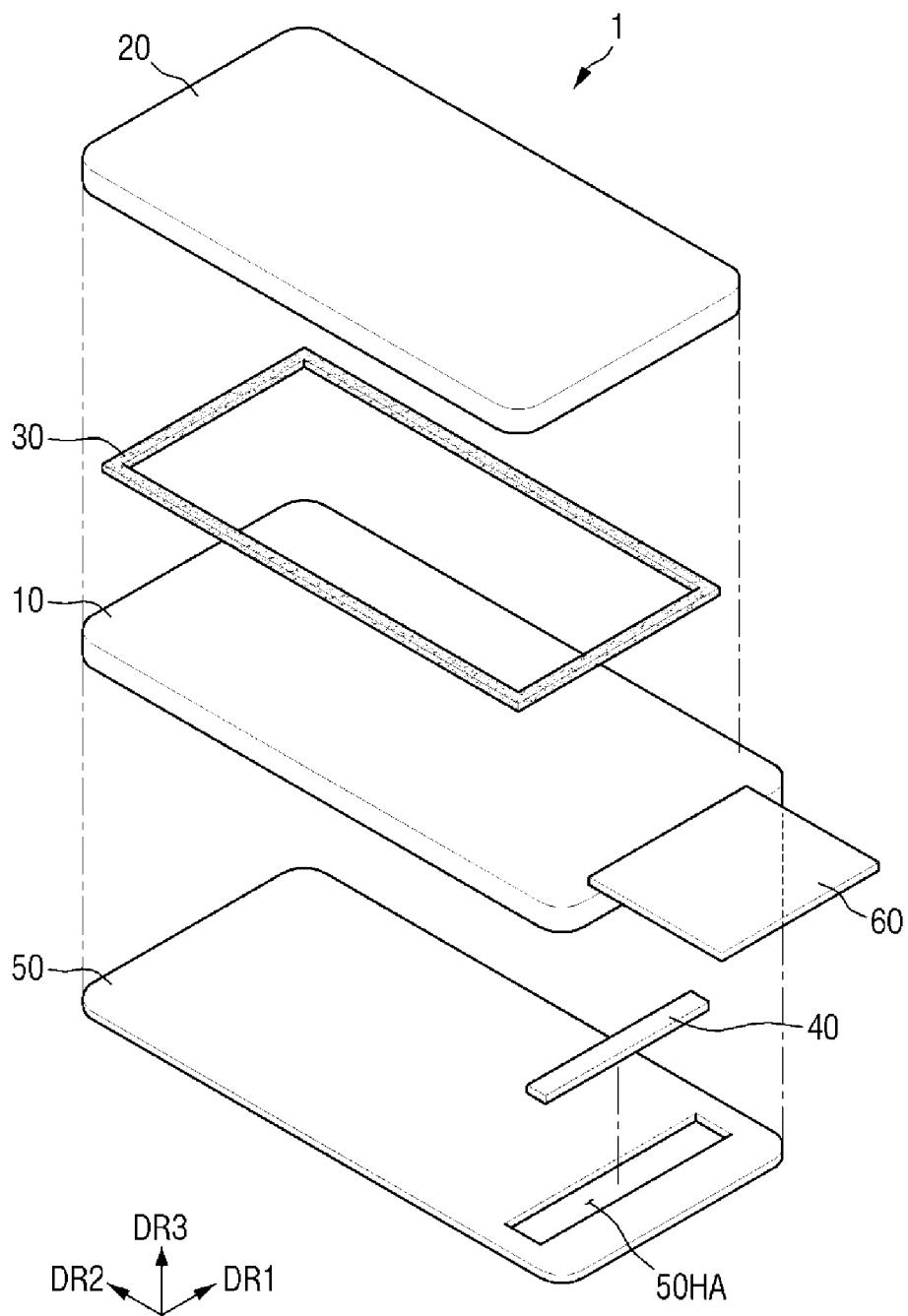
FIG. 1 is an exploded perspective view of a display device according to an embodiment.
Figure 2:
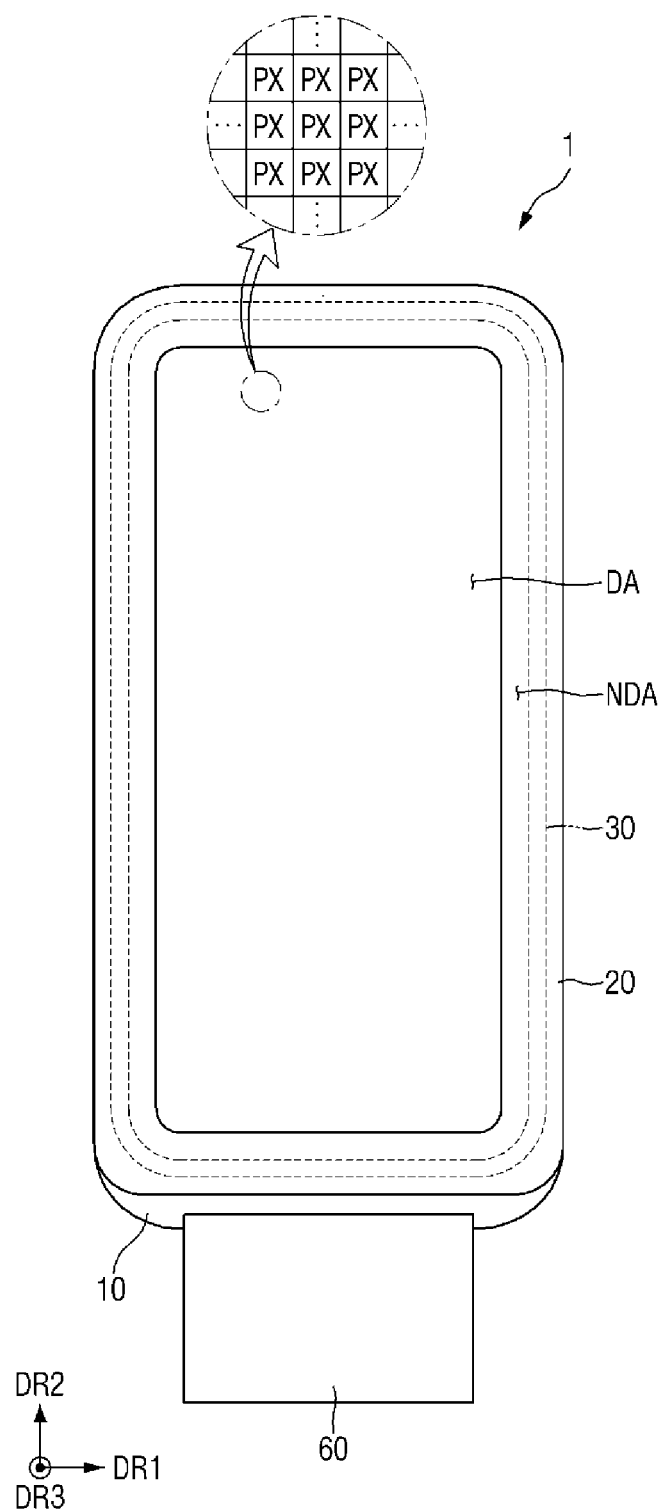
FIG. 2 is a plan view of the display device according to the embodiment.
Figure 3:
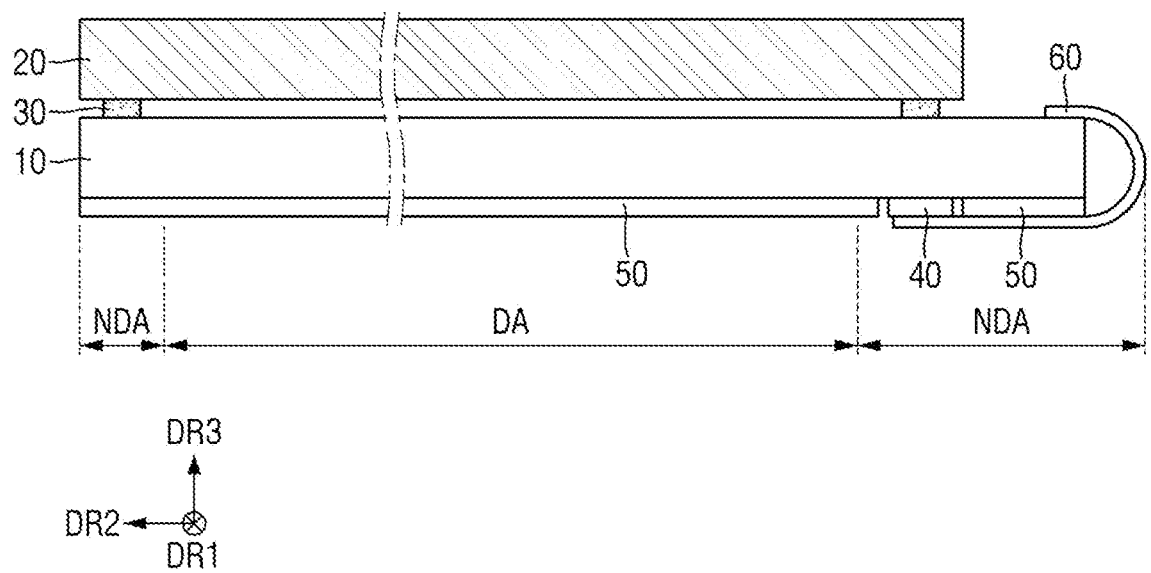
FIG. 3 is a schematic side view of the display device according to the embodiment.

FIG. 1 is an exploded perspective view of a display device 1 according to an embodiment. FIG. 2 is a plan view of the display device 1 according to the embodiment. FIG. 3 is a schematic side view of the display device 1 according to the embodiment.

Referring to FIGS. 1 through 3, the display device 1 according to the embodiment may include a display panel 10, an encapsulation substrate 20, a sealing member 30, a display driving circuit 40, and a display circuit board 60. The display device 1 may further include an under-panel member 50.

In the drawings, a first direction DR1, a second direction DR2, and a third direction DR3 are defined. The first direction DR1 and the second direction DR2 may be perpendicular to each other in one plane. The third direction DR3 may be perpendicular to the plane in which the first direction DR1 and the second direction DR2 are located. The third direction DR3 is perpendicular to each of the first direction DR1 and the second direction DR2. In embodiments, the third direction DR3 indicates a thickness direction of the display device 1.

In the present specification, unless otherwise stated, "above" and "top" refer to an upward direction from the display panel 10 (or a direction from the display panel 10 toward the encapsulation substrate 20), that is, the third direction DR3. Likewise, "upper surface" refers to a surface in a top portion. In addition, "under" and "bottom" refer to a downward direction from the display panel 10 (or a direction from the display panel 10 toward the under-panel member 50), that is, a direction opposite to the third direction DR3. Likewise, "lower surface" refers to a surface in a bottom portion. In addition, "left," "right," "upper," and "lower" directions in the plane of the display device 1 refer to directions as follows. For example, "left side" refers to a direction opposite to the first direction DR1, "right side" refers to the first direction DR1, "upper side" refers to the second direction DR2, and "lower side" refers to a direction opposite to the second direction DR2.

The display device 1 may refer to any electronic device that provides a display screen. Examples of the display device 1 may include various electronic devices that provide display screens, including small and medium-sized electronic devices such as tablet personal computers ("PCs"), smartphones, car navigation units, cameras, center information displays ("CIDs") provided in cars, wristwatch-type electronic devices, personal digital assistants ("PDAs"), portable multimedia players ("PMPs") and game machines and medium and large-sized electronic devices such as televisions, external billboards, monitors, PCs and notebook computers. However, these are just examples, and it is obvious that the display device 1 can also be employed in other electronic devices without departing from the concept of the present disclosure.

The display device 1 may have a rectangular planar shape having short sides in the first direction DR1 and long sides in the second direction DR2 intersecting the first direction DR1. Each corner where a short side extending in the first direction DR1 meets a long side extending in the second direction DR2 may be rounded or right-angled. The planar shape of the display device 1 is not limited to the quadrangular shape but may also be another polygonal shape, a circular shape, or an oval shape.

The display device 1 may include a display area DA and a non-display area NDA. The display area DA may be an area where an image can be displayed, and the non-display area NDA may be an area where no image is displayed. The display area DA may also be referred to as an active area, and the non-display area NDA may also be referred to as an inactive area. The display area DA may have a rectangular planar shape similar to the overall shape of the display device 1. The display area DA may generally occupy a center of the display device 1.

The display area DA may include a plurality of pixels PX. The pixels PX may be arranged in a matrix direction. Each of the pixels PX may be rectangular or square in a plan view. However, the shape of each of the pixels PX is not limited to these examples and may also be a rhombic shape having each side inclined with respect to a side of the display device 1 in another embodiment. The pixels PX may be alternately arranged in a stripe or pentile type. In addition, each of the pixels PX may include at least one light emitting element that emits light of a specific wavelength band to display a specific color.

The non-display area NDA may be disposed around the display area DA. The non-display area NDA may completely or partially surround the display area DA. The display area DA may be rectangular, and the non-display area NDA may be disposed adjacent to each side of the display area DA. The non-display area NDA may forma bezel of the display device 1. In the non-display area NDA, a driving circuit, a driving element, or wirings for driving the display area DA may be disposed.

The display panel 10 (or a first substrate) may be disposed in the display area DA and the non-display area NDA of the display device 1, and may include a display area DA and a non-display area NDA corresponding to the display area DA and the non-display area NDA of the display device 1, respectively.

A planar shape of the display panel 10 corresponds to the planar shape of the display device 1 to which the display panel 10 is applied. For example, when the display device 1 is substantially rectangular in a plan view, the display panel 10 may also be substantially rectangular. However, the present disclosure is not limited thereto, and the planar shape of the display panel 10 may also be different from the planar shape of the display device 1 in another embodiment. The display panel 10 may be formed flat, but the present disclosure is not limited thereto. For example, the display panel 10 may also include a curved part having a constant or varying curvature at its left and right ends in another embodiment.

The display panel 10 may be a light emitting display panel including light emitting elements. The display panel 10 may include the light emitting elements to provide light necessary for screen display. For example, the display panel 10 may be an organic light emitting display panel using organic light emitting diodes including organic light emitting layers, a micro light emitting diode display panel using micro light emitting diodes, a quantum dot light emitting display panel using quantum dot light emitting diodes including quantum dot light emitting layers, or an inorganic light emitting display panel using inorganic light emitting elements including inorganic semiconductors. A case where the display panel 10 is an organic light emitting display panel will be mainly described below.

The encapsulation substrate 20 (or a second substrate) is disposed above the display panel 10. The encapsulation substrate 20 may be spaced apart from the display panel 10 in the third direction DR3 to face the display panel 10.

The encapsulation substrate 20 may be disposed above the display area DA of the display panel 10 and at least a part of the non-display area NDA of the display panel 10. The encapsulation substrate 20 may completely cover the display area DA and extend toward the non-display area NDA. The encapsulation substrate 20 may be disposed to expose at least a part of a lower edge of the non-display area NDA of the display panel 10 in the third direction DR3. The planar area of the encapsulation substrate 20 may be smaller than the planar area of the display panel 10. However, the present disclosure is not limited thereto, and the planar area of the encapsulation substrate 20 may also be equal to the planar area of the display panel 10 in another embodiment.

The encapsulation substrate 20 disposed above the display panel 10 may encapsulate the light emitting elements of the display panel 10 together with the sealing member 30 to be described later, thereby protecting the light emitting elements of the display panel 10 from penetration of external moisture or impurities.

The encapsulation substrate 20 may be a transparent plate or a transparent film. For example, the encapsulation substrate 20 may include a glass material, a quartz material, or the like.

A planar shape of the encapsulation substrate 20 may be similar to the planar shape of the display panel 10. For example, when the display panel 10 is substantially rectangular in a plan view, the encapsulation substrate 20 may also be substantially rectangular. The planar area of the encapsulation substrate 20 may be smaller than or equal to the planar area of the display panel 10 so that the encapsulation substrate 20 can cover at least the display area DA of the display panel 10.

The sealing member 30 is disposed between the display panel 10 and the encapsulation substrate 20. The sealing member 30 may be in contact with an upper surface of the display panel 10 and a lower surface of the encapsulation substrate 20. The sealing member 30 may bond the display panel 10 and the encapsulation substrate 20 together.

The sealing member 30 may be disposed in the non-display area NDA to surround the display area DA. In an exemplary embodiment, the sealing member 30 may have a closed loop shape surrounding the display area DA in a plan view. Therefore, the sealing member 30 may surround the display area DA to completely encapsulate the light emitting elements of the display panel 10 disposed in the display area DA together with the encapsulation substrate 20 as described above. Therefore, the sealing member 30 may protect the light emitting elements of the display panel 10 from penetration of external moisture or impurities.

The display driving circuit 40 is disposed under the display panel 10. The display driving circuit 40 may be disposed on a lower surface of the non-display area NDA at an edge of the display panel 10. In an exemplary embodiment, the display driving circuit 40 may be disposed on the lower surface of the non-display area NDA at a lower edge of the display panel 10. Display pad parts (or second and third pad parts PDA2 and PDA3, see FIG. 8) to be described later may be provided on the lower surface of the non-display area NDA at the lower edge of the display panel 10, and the display driving circuit 40 may be attached onto lower surfaces of display pads DPD1 and DPD2 (see FIG. 8) of the display pad parts PDA2 and PDA3. The display pads DPD1 and DPD2 may include first display pads DPD1 and second display pads DPD2.

The display driving circuit 40 receives control signals and power supply voltages through the display circuit board 60 to be described later and generates and outputs signals and voltages for driving the display panel 10. The display driving circuit 40 may supply data voltages to data wirings of the display panel 10, supply driving voltages to driving voltage wirings, and supply scan control signals to a scan driver. The display driving circuit 40 may be formed as an integrated circuit ("IC") and attached onto a lower surface of the display panel 10 using a chip-on-glass ("COG") method, a chip-on-plastic ("COP") method, or an ultrasonic bonding method. However, the present disclosure is not limited thereto, and in another embodiment, the display driving circuit 40 may also be attached onto the display circuit board 60 to be described later. A case where the display driving circuit 40 is attached onto the lower surface of the display panel 10 will be mainly described below.

The display circuit board 60 may be disposed on the non-display area NDA at an edge of the display panel 10. In an exemplary embodiment, the display circuit board 60 may be disposed on an upper surface of the non-display area NDA at the lower edge of the display panel 10. Aside of the display circuit board 60 may be attached onto circuit pads PD (see FIG. 4) of a circuit pad part (or a first pad part PDA1, see FIG. 4) provided on the upper surface of the display panel 10 at a lower side of the display panel 10. The display circuit board 60 may be attached onto the upper surface of the display panel 10 using an anisotropic conductive film ("ACF"). Therefore, the display circuit board 60 may be electrically connected to the circuit pads PD of the display panel 10.

The display circuit board 60 may be bent toward the lower surface of the display panel 10. A side of the display circuit board 60 may be disposed on the upper surface of the display panel 10 as described above, and the display circuit board 60 may be bent toward the lower surface of the display panel 10 so that the other side of the display circuit board 60 can face the lower surface of the display panel 10 as shown in FIG. 3. The display circuit board 60 may be a flexible printed circuit board that can be bent. However, the present disclosure is not limited thereto, and the display circuit board 60 may also be a rigid printed circuit board that is hard and not easily bent or a composite printed circuit board including both a rigid printed circuit board and a flexible printed circuit board in another embodiment. When the display circuit board 60 is a rigid printed circuit board or a composite printed circuit board, the display panel 10 and the display circuit board 60 may be connected using a ductile film. The ductile film may be a flexible film that can be bent.

The under-panel member 50 is disposed under the display panel 10. The under-panel member 50 may be disposed on a part of the lower surface of the display panel 10 on which the display driving circuit 40 is not disposed. The under-panel member 50 may be disposed to cover the part of the lower surface of the display panel 10 on which the display driving circuit 40 is not disposed. The under-panel member 50 may define an opening 50HA penetrating the under-panel member 50. The opening 50HA may be defined to correspond to the display driving circuit 40 disposed on the lower surface of the display panel 10 and to expose the display driving circuit 40.

A thickness of the under-panel member 50 may be equal to a thickness of the display driving circuit 40 or may be greater than the thickness of the display driving circuit 40 in the third direction DR3. The under-panel member 50 may compensate for a step formed on the lower surface of the display panel 10 by the display driving circuit 40 attached onto the lower surface of the display panel 10 and protect the display driving circuit 40.

The under-panel member 50 may include at least one of a light absorbing member for absorbing light incident from the outside, a buffer member for absorbing external impact, and a heat dissipating member for efficiently dissipating heat generated from the display panel 10.

The light absorbing member may be disposed under the display panel 10. The light absorbing member blocks transmission of light to prevent elements disposed under the light absorbing member, for example, the display driving circuit 40, etc. from being seen from above the display panel 10. The light absorbing member may include a light absorbing material such as a black pigment or dye.

The buffer member may be disposed under the light absorbing member. The buffer member absorbs external impact to prevent the display panel 10 from being damaged. The buffer member may be composed of a single layer or a plurality of layers. For example, the buffer member may include or be made of polymer resin such as polyurethane, polycarbonate, polypropylene or polyethylene or may include or be made of an elastic material such as sponge formed by foaming rubber, a urethane-based material or an acrylic-based material. The buffer member may be a cushion layer.

The heat dissipating member may be disposed under the buffer member. The heat dissipating member may include a first heat dissipating layer containing graphite or carbon nanotubes and a second heat dissipating layer formed of a metal thin film (such as copper, nickel, ferrite or silver) capable of shielding electromagnetic waves and having excellent thermal conductivity.

Figure 4:
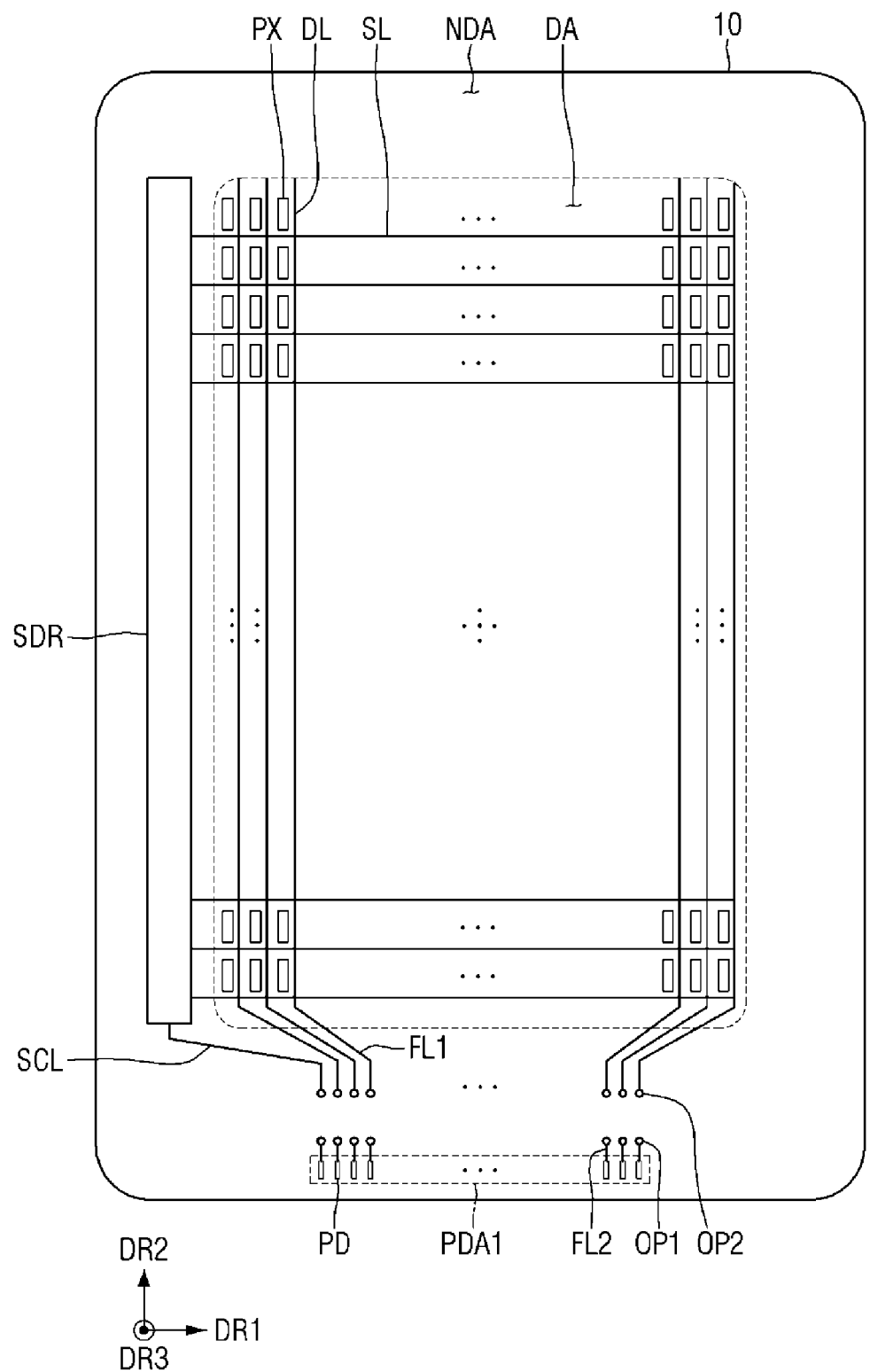
FIG. 4 is a schematic plan view of a display panel according to an embodiment.
Figure 5:
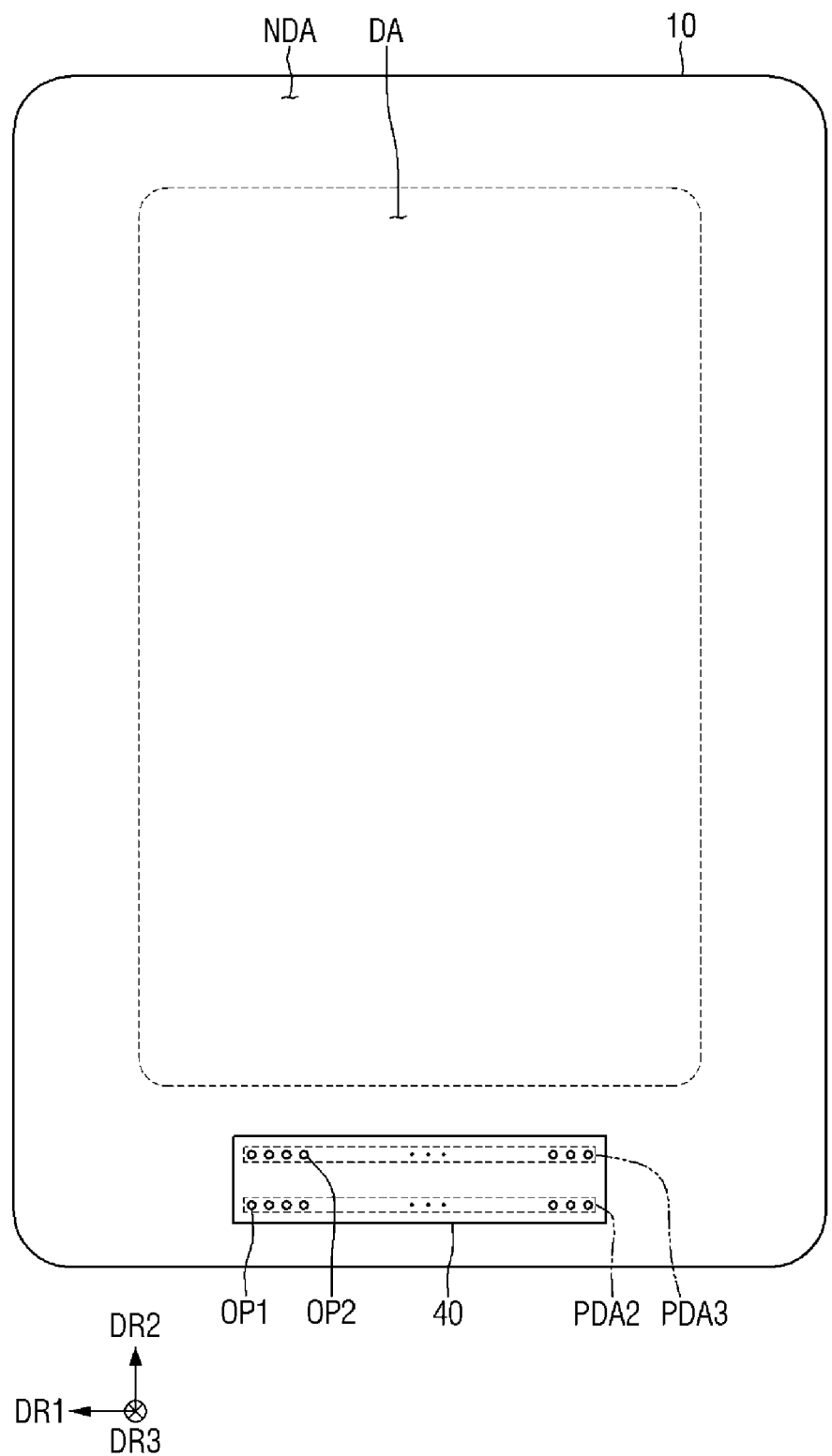
FIG. 5 is a bottom view illustrating the arrangement of the display panel and a display driving circuit according to an embodiment.

FIG. 4 is a schematic plan view of the display panel 10 according to an embodiment. FIG. 5 is a bottom view illustrating the arrangement of the display panel 10 and the display driving circuit 40 according to an embodiment.

In FIG. 4, only the pixels PX, scan lines SL, data lines DL, scan control lines SCL, signal lines FL1 and FL2, a scan driver SDR, the circuit pads PD and a plurality of through holes OP1 and OP2 of the display panel 10 are illustrated for ease of description.

In FIG. 5, only the display driving circuit 40 disposed on the lower surface of the display panel 10 and the through holes OP1 and OP2 are illustrated for ease of description. It should be noted that FIG. 5 is a bottom view of the lower surface of the display panel 10 seen from under the display panel 10.

Referring to FIGS. 4 and 5, the display panel 10 may include the display area DA in which the pixels PX are formed to display an image and the non-display area NDA disposed around the display area DA. The non-display area NDA may be an area extending from the outside of the display area DA to edges of the display panel 10.

The non-display area NDA of the display panel 10 may include pad parts PDA1 through PDA3. The pad parts PDA1 through PDA3 may be provided on a lower side of the non-display area NDA of the display panel 10. A plurality of pads PD, DPD1 and DPD2 may be disposed in the pad parts PDA1 through PDA3.

The pad parts PDA1 through PDA3 may include the first pad part PDA1 disposed on the upper surface of the display panel 10 and the second pad part PDA2 and the third pad part PDA3 formed on the lower surface of the display panel 10.

The first pad part PDA1 may be disposed in the non-display area NDA near a lower edge of the display area DA. The second pad part PDA2 may be disposed in the non-display area NDA near the lower edge of the display area DA and disposed between the first pad part PDA1 and the display area DA. The third pad part PDA3 may be disposed in the non-display area NDA near the lower edge of the display area DA and disposed between the second pad part PDA2 and the display area DA. The first through third pad parts PDA1 through PDA3 may be spaced apart from each other in the second direction DR2 in a plan view. That is, the first through third pad parts PDA1 through PDA3 may not overlap in the third direction DR3.

The scan lines SL, the data lines DL, and the pixels PX may be disposed in the display area DA. The scan lines SL may be disposed parallel to each other in the first direction DR1 and spaced apart from each other in the second direction DR2. The data lines DL may be disposed parallel to each other in the second direction DR2 intersecting the first direction DR1 and spaced apart from each other in the first direction DR1.

Each of the pixels PX may be connected to at least one of the scan lines SL and one of the data lines DL. Each of the pixels PX may include thin-film transistors including a driving transistor and at least one switching transistor, a light emitting element (or an organic light emitting diode), and a capacitor. Each of the pixels PX may receive a data voltage of a data line DL in response to a scan signal transmitted from a scan line SL and may emit light by supplying a driving current to the light emitting element according to the data voltage applied to a gate electrode of the driving transistor.

The scan driver SDR may be disposed in the non-display area NDA. In an exemplary embodiment, the scan driver SDR may be disposed in the non-display area NDA at a left edge of the display area DA. However, the present disclosure is not limited thereto. In another embodiment, for example, the scan driver SDR may be disposed both in the non-display area NDA at the left edge of the display area DA and the non-display area NDA at a right edge of the non-display area NDA.

The scan driver SDR is connected to the display driving circuit 40 through the scan control lines SCL. The scan driver SDR may receive a scan control signal of the display driving circuit 40 through the scan control lines SCL. The scan driver SDR generates scan signals according to the scan control signal and supplies the scan signals to the scan lines SL.

In the first pad part PDA1, a plurality of circuit pads PD connected to the display circuit board 60 described above may be disposed. The circuit pads PD may be spaced apart from each other in the first direction DR1.

In the second pad part PDA2, a plurality of first through holes OP1 penetrating a base substrate 110 (see FIG. 9) of the display panel 10 which will be described later may be defined. The first through holes OP1 may be spaced apart from each other in the first direction DR1.

In the third pad part PDA3, a plurality of second through holes OP2 penetrating the base substrate 110 (see FIG. 9) of the display panel 10 which will be described later may be defined. The second through holes OP2 may be spaced apart from each other in the first direction DR1. The second through holes OP2 may be spaced apart from the first through holes OP1 in the second direction DR2.

The scan control lines SCL and the signal lines FL1 and FL2 may be disposed in the non-display area NDA. In an exemplary embodiment, the scan control lines SCL and the signal lines FL1 and FL2 may be disposed in the non-display area NDA near the lower edge of the display area DA. The scan control lines SCL and the signal lines FL1 and FL2 may at least partially overlap the first through third pad parts PDA1 through PDA3.

The signal lines FL1 and FL2 may include first signal lines FL1 and second signal lines FL2.

The first signal lines FL1 may be disposed in the non-display area NDA and may extend to at least a portion of the third pad part PDA3. The first signal lines FL1 may extend from the data lines DL to the second through holes OP2 defined in the third pad part PDA3. An end of each first signal line FL1 may be connected to a data line DL, and the other end opposite to the end of the first signal line FL1 may overlap a second through hole OP2 in the third direction DR3. The first signal lines FL and the second through holes OP2 may correspond one-to-one to each other.

The second signal lines FL2 may be disposed in the non-display area NDA and disposed in the second pad part PDA2 and the first pad part PDA1. An end of each second signal line FL2 may overlap a first through hole OP1 disposed in the second pad part PDA2 in the third direction DR3, and the other end opposite to the end of the second signal line FL2 may be connected to a circuit pad PD disposed in the first pad part PDA1. The second signal lines FL2 and the first through holes OP1 may correspond one-to-one to each other.

The display driving circuit 40 may be disposed on the lower surface of the display panel 10. The display driving circuit 40 may overlap the second and third pad parts PDA2 and PDA3 but may not overlap the first pad part PDA1. The third pad part PDA3 may overlap an upper side of the display driving circuit 40, and the second pad part PDA2 may overlap a lower side of the display driving circuit 40.

Figure 6:
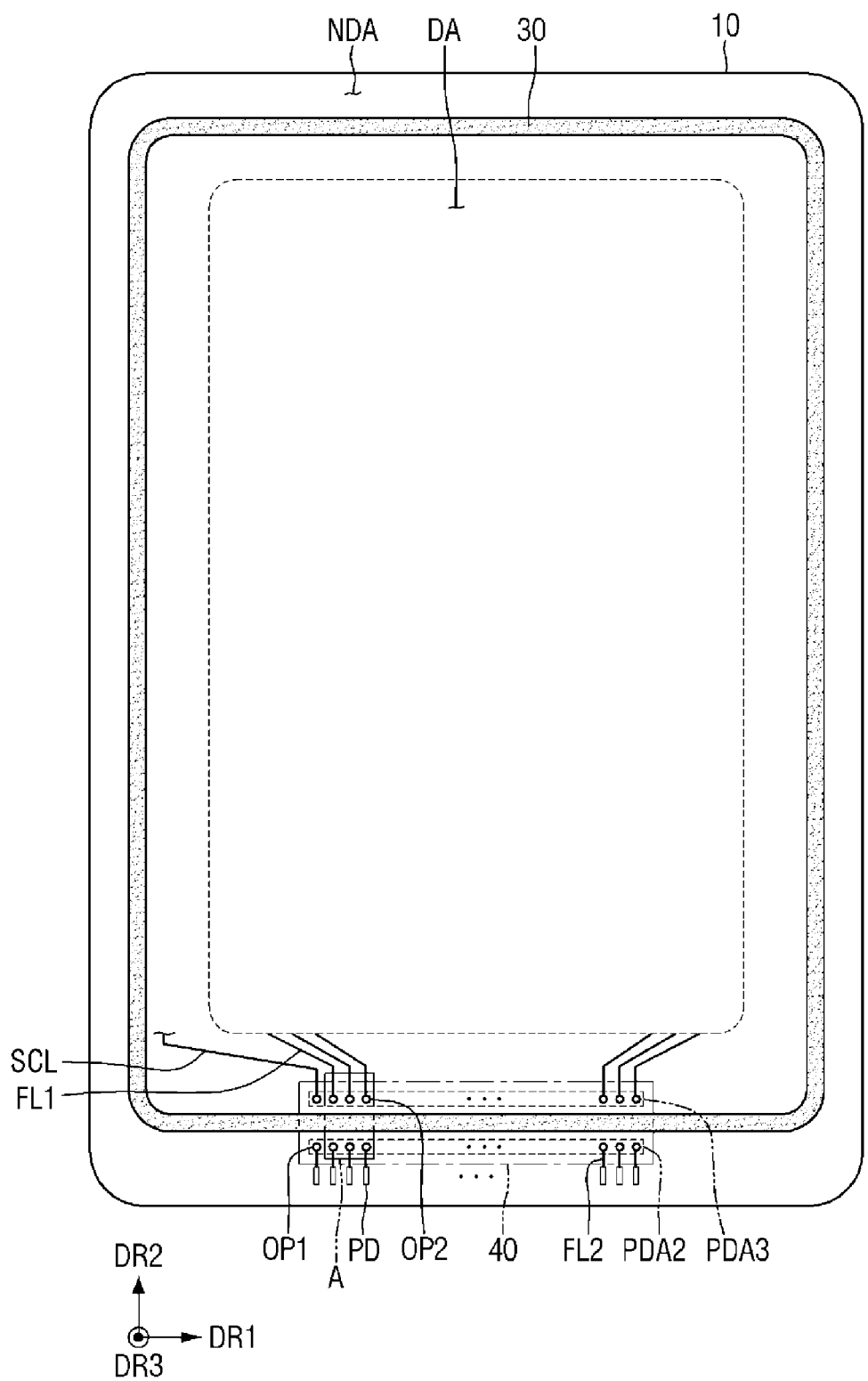
FIG. 6 is a layout view illustrating the relative positional relationship between the display panel and a sealing member of the display device according to the embodiment.
Figure 7:
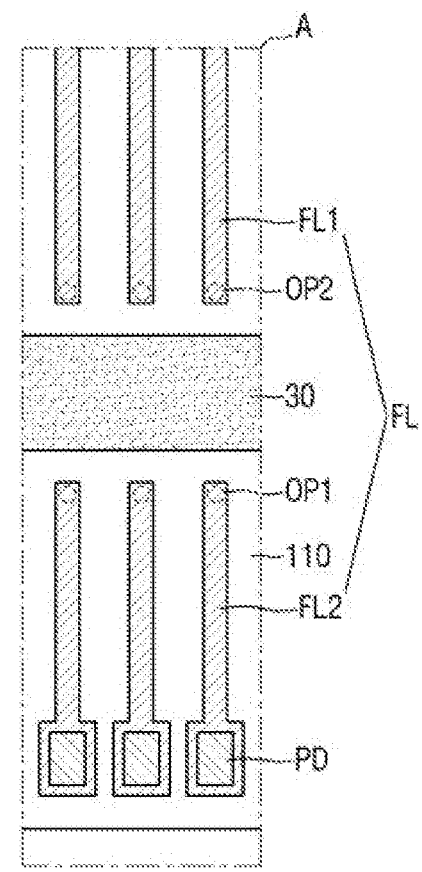
FIG. 7 is an enlarged plan view of area A in FIG. 6.
Figure 7:
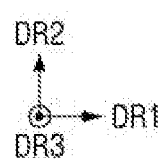
Figure 8:
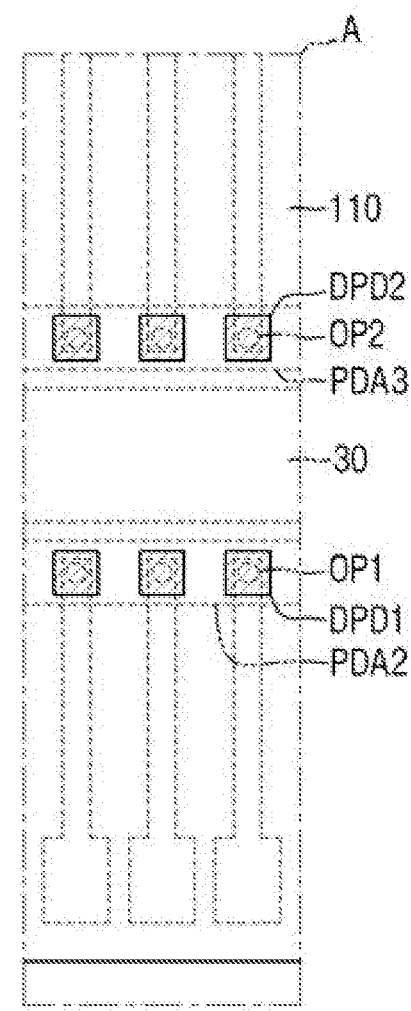
FIG. 8 is an enlarged bottom view of area A in FIG. 6.
Figure 8:
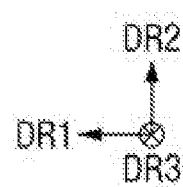

FIG. 6 is a layout view illustrating the relative positional relationship between the display panel 10 and the sealing member 30 of the display device 1 according to the embodiment. FIG. 7 is an enlarged plan view of area A in FIG. 6. FIG. 8 is an enlarged bottom view of area A in FIG. 6.

Referring to FIG. 6, the sealing member 30 may be disposed on the upper surface of the display panel 10. The sealing member 30 may be disposed in the non-display area NDA of the display panel 10. The sealing member 30 may have a closed loop shape surrounding the display area DA in a plan view.

The sealing member 30 may be disposed not to overlap the first signal lines FL1, the second signal lines FL2, the first through holes OP1 and the second through holes OP2 disposed in the non-display area NDA of the display panel 10.

At least a part of the sealing member 30 may be disposed between the first signal lines FL1 and the second signal lines FL2 spaced apart from each other in the second direction DR2 in a plan view. The first signal lines FL1 may be disposed inside an area outlined by the sealing member 30 in a plan view, and the second signal lines FL2 may be disposed outside the area outlined by the sealing member 30 in a plan view.

Likewise, the sealing member 30 may be disposed between the first through holes OP1 and the second through holes OP2 spaced apart from each other in the second direction DR2. The second through holes OP2 may be defined inside the area outlined by the sealing member 30 in a plan view, and the first through holes OP1 may be defined outside the area outlined by the sealing member 30 in a plan view.

The display driving circuit 40 disposed under the display panel 10 may at least partially cover the first through holes OP1, the second through holes OP2 and the sealing member 30 spaced apart from each other in the second direction DR2 in a plan view.

The display panel 10 may include the base substrate 110. The base substrate 110 will be described in detail later with reference to FIG. 9.

Referring to FIGS. 6 through 8, the first signal lines FL1, the second signal lines FL2, the circuit pads PD, and the sealing member 30 may be disposed on an upper surface of the base substrate 110. In addition, the display pads DPD1 and DPD2 may be disposed on a lower surface of the base substrate 110. In addition, the first through holes OP1 and the second through holes OP2 penetrating the base substrate 110 in the third direction DR3 may be defined in the base substrate 110.

The first signal lines FL1 and the second signal lines FL2 may be spaced apart from each other with the sealing member 30 interposed between them.

Ends of the first signal lines FL1 may cover, in the third direction DR3, the second through holes OP2 defined adjacent to an upper side of the sealing member 30. Ends of the second signal lines FL2 may cover, in the third direction DR3, the first through holes OP1 defined adjacent to a lower side of the sealing member 30. The other ends of the second signal lines FL2 may overlap the circuit pads PD. The circuit pads PD may be disposed on the other ends of the second signal lines FL2.

The display pads DPD1 and DPD2 may include the first display pads DPD1 and the second display pads DPD2. Each of the first display pads DPD1 and each of the second display pads DPD2 may be disposed on lower surfaces of the second pad part PDA2 and the third pad part PDA3 of the base substrate 110, respectively.

The first display pads DPD1 may be disposed in the second pad part PDA2. The first display pads DPD1 may be spaced apart from each other in the first direction DR1.

The first display pads DPD1 may overlap the first through holes OP1 defined in the second pad part PDA2. The first display pads DPD1 may completely cover the first through holes OP1 in the third direction DR3.

The second display pads DPD2 may be disposed in the third pad part PDA3. The second display pads DPD2 may be spaced apart from each other in the first direction DR1. The second display pads DPD2 may overlap the second through holes OP2 defined in the third pad part PDA3. The second display pads DPD2 may completely cover the second through holes OP2 in the third direction DR3.

The first display pads DPD1 and the second display pads DPD2 may be spaced apart from each other. The first display pads DPD1 and the second display pads DPD2 may not overlap the sealing member 30. The sealing member 30 may be disposed between each of the first display pads DPD1 and each of the second display pads DPD2.

The scan control lines SCL and the signal lines FL1 and FL2 may be electrically connected to the display driving circuit 40 and the display circuit board 60 through the through holes OP1 and OP2, the display pads DPD1 and DPD2, and the circuit pads PD. This will be described in detail later.

Figure 9:
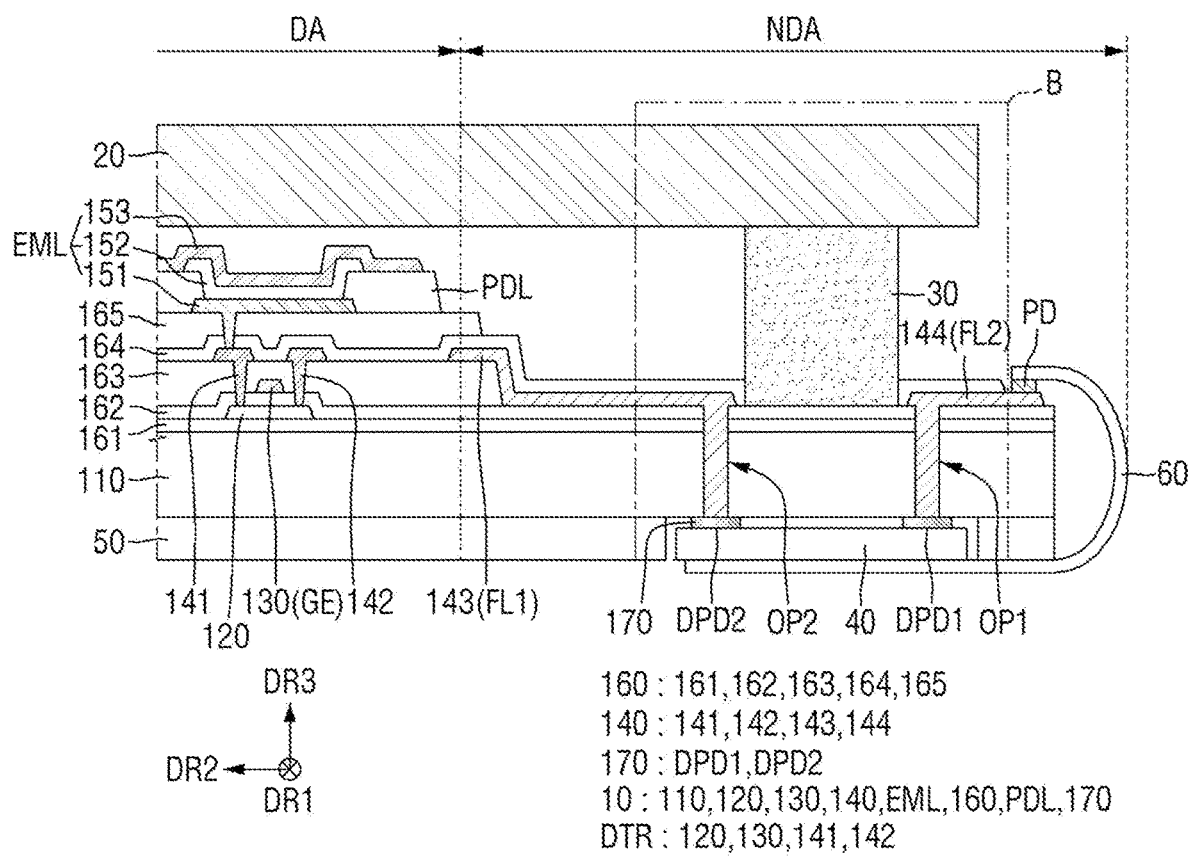
FIG. 9 is a cross-sectional view of the display device according to the embodiment.

FIG. 9 is a cross-sectional view of the display device 1 according to an embodiment.

In FIG. 9, a part of a cross section of the display area DA and a cross section of the non-display area NDA disposed adjacent to a lower side of the display area DA are illustrated. Although only an area where a driving transistor DTR among a plurality of transistors disposed in the display area DA is disposed is illustrated in FIG. 9 for ease of description, switching transistors and a capacitor may further be disposed in the display area DA. The driving transistor DTR will hereinafter be referred to a transistor DTR.

Referring to FIG. 9, the display panel 10 includes the base substrate 110 and a semiconductor layer 120, a plurality of conductive layers, a plurality of insulating layers and a light emitting element layer EML disposed on the base substrate 110. The conductive layers may include a first conductive layer 130 (or a gate conductive layer), a second conductive layer 140 (or a data conductive layer) disposed on the upper surface of the base substrate 110 and a third conductive layer 170 (or a pad electrode layer) disposed on the lower surface of the base substrate 110. The insulating layers may include a gate insulating layer 162, an interlayer insulating film 163, a passivation layer 164, and a via layer 165. The layers of the display panel 10 may be sequentially disposed on the upper surface of the base substrate 110 in the order of a buffer layer 161, the semiconductor layer 120, the gate insulating layer 162, the first conductive layer 130, the interlayer insulating film 163, the second conductive layer 140, the passivation layer 164, the via layer 165, and the light emitting element layer EML. The third conductive layer 170 may be disposed on the lower surface of the base substrate 110 as described above. Each layer described above may be a single layer, but may also be a stacked layer including a plurality of layers. Another layer may also be further disposed between the layers.

The layers of the display device 1 will now be described with reference to FIGS. 6 through 9.

The base substrate 110 may be disposed in the display area DA and the non-display area NDA.

The base substrate 110 may be a transparent rigid substrate. The base substrate 110 may include or be made of an insulating material such as glass, quartz, or polymer resin. The polymer material may be, for example, polyethersulfone ("PES"), polyacrylate ("PA"), polyarylate ("PAR"), polyetherimide ("PE"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination of the same. The base substrate 110 may also include a metal material.

In the base substrate 110, the through holes OP1 and OP2 penetrating the base substrate 110 may be defined in the non-display area NDA.

The buffer layer 161 is disposed on the base substrate 110. The buffer layer 161 may be disposed on the upper surface of the base substrate 110 to cover the entire surface of the base substrate 110. The buffer layer 161 may be disposed in the display area DA and the non-display area NDA.

The buffer layer 161 may protect thin-film transistors and light emitting elements disposed on the base substrate 110 from moisture introduced through the base substrate 110 which is vulnerable to moisture penetration.

The buffer layer 161 may be composed of one or more inorganic layers stacked alternately. The buffer layer 161 may be a multilayer in which one or more inorganic layers including silicon oxide (SiOx), silicon nitride (SiNx), silicon oxynitride (SiON), etc. are alternately stacked. The buffer layer 161 is optional.

The transistor DTR is provided on the buffer layer 161 disposed in the display area DA. The transistor DTR may include the semiconductor layer 120, a gate electrode GE, a source electrode 141, and a drain electrode 142. In FIG. 9, the transistor DTR is formed in a top gate manner in which the gate electrode GE is located above the semiconductor layer 120. However, it should be noted that the present disclosure is not limited thereto. The transistor DTR may also be formed in a bottom gate manner in which the gate electrode GE is located under the semiconductor layer 120 or a double gate manner in which the gate electrode GE is located both above and under the semiconductor layer 120 in another embodiment.

The semiconductor layer 120 is disposed on the buffer layer 161. The semiconductor layer 120 may be disposed in a transistor area in which the transistor DTR is disposed. The semiconductor layer 120 forms a channel of the transistor DTR. The semiconductor layer 120 may include or be made of a silicon-based semiconductor material or an oxide-based semiconductor material. Although not illustrated, a light blocking layer may be further disposed between the buffer layer 161 and the semiconductor layer 120 to block external light from entering the semiconductor layer 120.

The gate insulating layer 162 is disposed on the semiconductor layer 120. The gate insulating layer 162 may be disposed on the buffer layer 161 to cover the entire surface of the buffer layer 161 disposed in the display area DA and the non-display area NDA. However, the present disclosure is not limited thereto, and the gate insulating layer 162 may also have the same pattern as the gate electrode GE to be described later. In this case, sidewalls of the gate insulating layer 162 may be generally aligned with sidewalls of the gate electrode GE.

The gate insulating layer 162 may be an inorganic layer. The gate insulating layer 162 may include a silicon compound, a metal oxide, or the like. For example, the gate insulating layer 162 may include silicon oxide, silicon nitride, silicon oxynitride, aluminum oxide, tantalum oxide, hafnium oxide, zirconium oxide, titanium oxide, etc.

The through holes OP1 and OP2 penetrating the base substrate 110, the buffer layer 161 and the gate insulating layer 162 may be provided in an area adjacent to the sealing member 30 disposed in the non-display area NDA. The through holes OP1 and OP2 may include a first through hole OP1 defined outside the area outlined by the sealing member 30 in the non-display area NDA and a second through hole OP2 defined inside the area outlined by the sealing member 30 in the non-display area NDA. The first through hole OP1 and the second through hole OP2 may be cylindrical. However, the present disclosure is not limited thereto, and the first through hole OP1 and the second through hole OP2 may also be polygonal, oval, or the like in a cross-sectional view in another embodiment.

The first conductive layer 130 is disposed on the gate insulating layer 162. The first conductive layer 130 may be a gate conductive layer. The first conductive layer 130 may be disposed in the transistor area of the display area DA. The gate electrode GE of the transistor DTR may correspond to the first conductive layer 130. In addition, the scan lines SL described above, gate lines, etc. may also correspond to the first conductive layer 130, but the present disclosure is not limited thereto.

The first conductive layer 130 may be, but is not limited to, a single layer or a multilayer including any one or more of molybdenum (Mo), aluminum (Al), chromium (Cr), gold (Au), titanium (Ti), nickel (Ni), neodymium (Ne), copper (Cu), and alloys of the same.

The interlayer insulating film 163 is disposed on the first conductive layer 130. The interlayer insulating film 163 may be disposed in the display area DA and a part of the non-display area NDA. The interlayer insulating film 163 may not be disposed at edges of the non-display area NDA.

The interlayer insulating film 163 may include an inorganic insulating material such as silicon oxide, silicon nitride, silicon oxynitride, hafnium oxide, aluminum oxide, titanium oxide, tantalum oxide, or zinc oxide. In an embodiment, the interlayer insulating film 163 may include SiON.

The second conductive layer 140 is disposed on the interlayer insulating film 163. The source electrode 141 and the drain electrode 142 of the transistor DTR and a first signal line 143 and a second signal line 144 may correspond to the second conductive layer 140. The data lines DL disposed in the display area DA and the scan control lines SCL disposed in the non-display area NDA may also correspond to the second conductive layer 140. The second conductive layer 140 may not overlap the sealing member 30 disposed in the non-display area NDA. That is, the second conductive layer 140 may not be disposed in at least a part of the non-display area NDA. This will be described in detail later.

The second conductive layer 140 may be, but is not limited to, a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The source electrode 141 and the drain electrode 142 may be disposed in the display area DA. The source electrode 141 and the drain electrode 142 may be disposed in the transistor area in which the transistor DTR is disposed. Each of the source electrode 141 and the drain electrode 142 may be connected to the semiconductor layer 120 through a contact hole penetrating the interlayer insulating film 163 and the gate insulating layer 162.

The first signal line 143 and the second signal line 144 may be disposed in the non-display area NDA. The first signal line 143 and the second signal line 144 may be spaced apart from each other in the second direction DR2 on the buffer layer 161 or the gate insulating layer 162.

The first signal line 143 may be disposed on the buffer layer 161 of the non-display area NDA and may extend toward the display area DA adjacent to the non-display area NDA to be disposed on upper and side surfaces of the interlayer insulating film 163 of the display area DA.

Specifically, the first signal line 143 may be disposed between the display area DA and the sealing member 30 disposed in the non-display area NDA. A first end of the first signal line 143 may be disposed on the upper surface of the interlayer insulating film 163 of the display area DA, and a second end opposite to the first end of the first signal line 143 may be disposed adjacent to the sealing member 30 disposed in the non-display area NDA. The second through hole OP2 penetrating the base substrate 110, the buffer layer 161 and the gate insulating layer 162 may be filled with at least a part of the first signal line 143. Therefore, the first signal line 143 may be electrically connected to a second display pad DPD2 (which will be described later) of the third conductive layer 170 disposed on the lower surface of the base substrate 110 through the second through hole OP2. The second through hole OP2 may be defined adjacent to the second end of the first signal line 143, but the present disclosure is not limited thereto.

The second signal line 144 may be disposed on the buffer layer 161 of the non-display area NDA.

Specifically, the second signal line 144 may be disposed outside the sealing member 30 in the non-display area NDA. A first end of the second signal line 144 may be disposed at an outer edge of the buffer layer 161, and a second end opposite to the first end of the second signal line 144 may be disposed adjacent to the sealing member 30 disposed in the non-display area NDA. The first end of the second signal line 144 may overlap a circuit pad PD disposed at an outer edge of the display panel 10 and may be electrically connected to the circuit pad PD. The first through hole OP1 penetrating the base substrate 110, the buffer layer 161 and the gate insulating layer 162 may be filled with at least a part of the second signal line 144. Therefore, the second signal line 144 may be electrically connected to a first display pad DPD1 (which will be described later) of the third conductive layer 170 disposed on the lower surface of the base substrate 110 through the first through hole OP1. The first through hole OP1 may be defined adjacent to the second end of the second signal line 144, but the present disclosure is not limited thereto.

The passivation layer 164 is disposed on the second conductive layer 140. The passivation layer 164 may be disposed in the display area DA and the non-display area NDA but may not be disposed in at least a part of the non-display area NDA. The passivation layer 164 may not be disposed in an area where the sealing member 30 is disposed in the non-display area NDA and may not be disposed on the second conductive layer 140 of the first pad part PDA1 where the circuit pad PD is disposed and thus may not overlap them. Therefore, the passivation layer 164 may expose at least a part of the second end of the second signal line 144. However, the present disclosure is not limited thereto, and the passivation layer 164 may also be disposed on the entire surface of the base substrate 110 to expose only at least a part of the second end of the second signal line 144 in another embodiment.

The passivation layer 164 covers and protects the second conductive layer 140. The passivation layer 164 may include an inorganic insulating material such as silicon oxide, silicon nitride, silicon oxynitride, hafnium oxide, aluminum oxide, titanium oxide, tantalum oxide, or zinc oxide.

The circuit pad PD (or a first pad) may be disposed on the second end of the second signal line 144. The circuit pad PD may be disposed on the second end of the second signal line 144 exposed by the passivation layer 164. The circuit pad PD may be disposed at an outer edge of the non-display area NDA. The second end of the second signal line 144 and the circuit pad PD may be electrically connected to each other.

A side of the display circuit board 60 may be attached onto the circuit pad PD. Therefore, the second signal line 144 and the display circuit board 60 may be electrically connected by the circuit pad PD so that signals provided by the display circuit board 60 can be delivered to the display driving circuit 40 through the second signal line 144.

The circuit pad PD may be, but is not limited to, a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The via layer 165 is disposed on the passivation layer 164. The via layer 165 may cover an upper surface of the passivation layer 164 and overlap the interlayer insulating film 163 adjacent to the non-display area NDA.

The via layer 165 may planarize a step due to the transistor DTR. The via layer 165 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene ("BCB"). The via layer 165 may further include a photosensitive material, but the present disclosure is not limited thereto. In an embodiment, the via layer 165 may include polyimide.

The light emitting element layer EML is disposed on the via layer 165. The light emitting element layer EML may be disposed in the display area DA The light emitting element layer EML may include a first electrode 151, a light emitting layer 152, and a second electrode 153.

The first electrode 151 is disposed on the via layer 165. The first electrode 151 may be connected to the source electrode 141 of the transistor DTR through a contact hole penetrating the via layer 165 and the passivation layer 164. An anode of each pixel may correspond to the first electrode 151. Therefore, the anode may be electrically connected to the source electrode 141 of the transistor DTR through the contact hole penetrating the via layer 165 and the passivation layer 164.

In a top emission structure in which the light emitting layer 152 emits light toward the second electrode 153, the first electrode 151 may include or be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

In a bottom emission structure in which the light emitting layer 152 emits light toward the first electrode 151, the first electrode 151 may include or be made of a transparent conductive material ("TCO") capable of transmitting light, such as indium tin oxide ("ITO") or indium zinc oxide ("IZO"), or a semi-transmissive conductive material such as magnesium (Mg), silver (Ag) or an alloy of Mg and Ag. In this case, when the first electrode 151 is made of a semi-transmissive conductive material, light output efficiency may be increased by a microcavity.

A pixel defining layer PDL may be disposed on the via layer 165 to define the first electrode 151 so as to define each pixel. That is, the pixel defining layer PDL may define an opening that exposes the first electrode 151. The opening may define an emission area of each pixel. The pixel defining layer PDL may cover edges of the first electrode 151.

The pixel defining layer PDL may include an inorganic insulating material such as silicon oxide, silicon nitride, silicon oxynitride, hafnium oxide, aluminum oxide, titanium oxide, tantalum oxide or zinc oxide or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The pixel defining layer PDL may be a single layer or a multilayer formed of a stacked layer of different materials.

Each pixel is an area where the first electrode 151, the light emitting layer 152 and the second electrode 153 are sequentially stacked so that holes from the first electrode 151 and electrons from the second electrode 153 combine together in the light emitting layer 152 to emit light.

The light emitting layer 152 is disposed on the first electrode 151 defined by the pixel defining layer PDL. That is, the light emitting layer 152 is disposed in the opening of the pixel defining layer PDL. The light emitting layer 152 may be an organic light emitting layer which includes an organic material to emit light of a predetermined color. When the light emitting layer 152 is a white light emitting layer that emits white light, it may be a common layer commonly formed in subpixels. In this case, the light emitting layer 152 may have a tandem structure of two or more stacks. Each of the stacks may include a hole transporting layer, at least one light emitting layer, and an electron transporting layer.

The second electrode 153 is disposed on the light emitting layer 152 and the pixel defining layer PDL. A cathode may correspond to the second electrode 153. The cathode may be disposed over the entire display area DA. Side surfaces of the second electrode 153 may be disposed in the non-display area NDA.

In the top emission structure, the second electrode 153 may include or be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When the second electrode 153 is made of a semi-transmissive conductive material, the light output efficiency may be increased by a microcavity.

In the bottom emission structure, the second electrode 153 may include or be made of a metal material having high reflectivity, such as a stacked structure (T/A/Ti) of aluminum and titanium, a stacked structure (ITO/AN/TO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

Referring to FIGS. 8 and 9, the third conductive layer 170 may be disposed on the lower surface of the base substrate 110. The third conductive layer 170 may be disposed in the second pad part PDA2 and the third pad part PDA3 of the non-display area NDA. The first display pad DPD1 disposed in the second pad part PDA2 and the second display pad DPD2 disposed in the third pad part PDA3 may correspond to the third conductive layer 170.

The third conductive layer 170 may be, but is not limited to, a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The first display pad DPD1 may be disposed to overlap the first through hole OP1 in a plan view. That is, the first display pad DPD1 may be disposed on the lower surface of the base substrate 110 to correspond to the first through hole OP1. As described above, the first display pad DPD1 may be electrically connected to the second signal line 144 filling the first through hole OP1.

The second display pad DPD2 may be disposed to overlap the second through hole OP2. That is, the second display pad DPD2 may be disposed on the lower surface of the base substrate 110 to correspond to the second through hole OP2. The second display pad DPD2 may be electrically connected to the first signal line 143 filling the second through hole OP2.

The display driving circuit 40 may be disposed under the first display pad DPD1 and the second display pad DPD2. The display driving circuit 40 may be disposed under the first display pad DPD1 and the second display pad DPD2 to completely cover the first display pad DPD1 and the second display pad DPD2. An upper surface of the display driving circuit 40 may be attached to the first display pad DPD1 and the second display pad DPD2. Therefore, the display driving circuit 40 may be electrically connected to the first signal line 143 and the second signal line 144 by the first display pad DPD1 and the second display pad DPD2, respectively.

The display driving circuit 40 is connected to the first display pad DPD1 to receive digital video data and timing signals from the display circuit board 60 through the second signal line 144. The display circuit board 60 may be connected to the second signal line 144 through the circuit pad PD. The display driving circuit 40 may convert the digital video data into analog positive/negative data voltages. The display driving circuit 40 is connected to the second display pad DPD2 to supply the data voltages to the data lines DL through the first signal line 143. In addition, the display driving circuit 40 is connected to the second display pad DPD2 to generate and supply a scan control signal for controlling the scan driver SDR through the scan control lines SCL.

The encapsulation substrate 20 may be disposed above the base substrate 110 to face the base substrate 110. The encapsulation substrate 20 may be disposed above the light emitting element layer EML. In some embodiments, the encapsulation substrate 20 and the second electrode 153 of the light emitting element layer EML may be spaced apart from each other in the display area DA. An inert gas such as nitrogen gas may fill a space between the display panel 10 and the encapsulation substrate 20. However, the present disclosure is not limited thereto, and a filler may also fill the space between the encapsulation substrate 20 and the display panel 10 in another embodiment.

The encapsulation substrate 20 may include a transparent material. For example, the encapsulation substrate 20 may include or be made of various materials such as a glass material and a plastic material such as polyethylene terephthalate (PET), polyethylene naphthalate (PEN) or polyimide. The base substrate 110 of the display panel 10 and the encapsulation substrate 20 may include the same material, but the present disclosure is not limited thereto.

The sealing member 30 may be disposed between the base substrate 110 and the encapsulation substrate 20. Specifically, the sealing member 30 may be disposed on the gate insulating layer 162 exposed by the first signal line 143 and the second signal line 144 in the non-display area NDA. The sealing member 30 may directly contact the gate insulating layer 162 or the buffer layer 161 disposed on the base substrate 110.

The sealing member 30 may not overlap, in the third direction DR3, the second conductive layer 140 disposed on the gate insulating layer 162 and the third conductive layer 170 in the non-display area NDA. Specifically, the sealing member 30 may not overlap the first signal line 143, the second signal line 144, the first display pad DPD1, and the second display pad DPD2 in the third direction DR3. The sealing member 30 may overlap the display driving circuit 40 in the third direction DR3.

The sealing member 30 may include a material having transparency and bonding the base substrate 110 of the display panel 10 and the encapsulation substrate 20 together. The sealing member 30 may be a cured frit. In the present specification, 'frit' may refer to a structure having glass properties formed by melting and curing glass in powder form optionally added with an additive. For example, the additive may be a laser absorber, an organic binder, a filler for reducing a coefficient of thermal expansion, or the like. A case where the sealing member 30 is a cured frit will be described below as an example.

The base substrate 110 of the display panel 10 and the encapsulation substrate 20 may be bonded together by the sealing member 30. The base substrate 110 and the encapsulation substrate 20 may be spaced apart from each other in the third direction DR3, and the sealing member 30 may be disposed in a space between the base substrate 110 and the encapsulation substrate 20 to contact the base substrate 110 and the encapsulation substrate 20. Specifically, an upper surface of the sealing member 30 may contact the lower surface of the encapsulation substrate 20, and a lower surface of the sealing member 30 may contact the upper surface of the base substrate 110. The sealing member 30 may include frit to bond the base substrate 110 and the encapsulation substrate 20 together through physical bonding with them.

In an exemplary embodiment, the sealing member 30 and the base substrate 110 or the display panel 10 and/or the sealing member 30 and the encapsulation substrate 20 may be partially bonded and integrated with each other. No separate adhesive layer or bonding layer may exist between the sealing member 30 and the base substrate 110 and/or between the sealing member 30 and the encapsulation substrate 20, and the sealing member 30 and the base substrate 110 and/or the sealing member 30 and the encapsulation substrate 20 may directly contact each other and thus be integrally bonded to each other.

A physical boundary may be included between the sealing member 30 and the base substrate 110 or the encapsulation substrate 20. However, a display device 1 according to another embodiment may include a fusion area MA in which no physical boundary exists between the sealing member 30 and the encapsulation substrate 20 or the base substrate 110 of the display panel 10 because the sealing member 30 is fused with the encapsulation substrate 20 or the base substrate 110 of the display panel 10. This will be described in detail later using other drawings.

In the display device 1 according to the embodiment, a plurality of conductive layers disposed in the non-display area NDA, that is, the second conductive layer 140 and the third conductive layer 170 are disposed not to overlap the sealing member 30 in a plan view. Specifically, the second conductive layer 140 disposed on the upper surface of the base substrate 110, that is, the signal lines 143 and 144 or FL1 and FL2 may not overlap the sealing member 30. In addition, the third conductive layer 170 disposed on the lower surface of the base substrate 110, that is, the display pads DPD1 and DPD2 may not overlap the sealing member 30.

The signal lines 143 and 144 or FL1 and FL2 disposed on the upper surface of the base substrate 110 and the display pads DPD1 and DPD2 disposed on the lower surface of the base substrate 110 may be electrically connected to each other through the through holes OP1 and OP2 penetrating the base substrate 110. Therefore, since the sealing member 30 and the conductive layers 140 and 170 do not overlap each other, when laser light is irradiated to the sealing member 30 to bond the base substrate 110 and the encapsulation substrate 20 together, the conductive layers 140 and 170 disposed on the base substrate 110 can be prevented from being damaged by the fusion area that may be formed between the base substrate 110 and the sealing member 30. In addition, when a focus is formed in the sealing member 30 and then laser light is irradiated, intensive energy may be transmitted to around the focus of the sealing member 30, and this energy may be converted into thermal energy or the like. Since the sealing member 30 and the conductive layers 140 and 170 do not overlap each other, the conductive layers 140 and 170 disposed in the non-display area NDA can be prevented from being damaged by the thermal energy.

Furthermore, since the sealing member 30 and the display driving circuit 40 overlap each other in the third direction DR3, the area of the non-display area NDA may be reduced. Therefore, a dead space of the display device 1 can be reduced.

Figure 10:
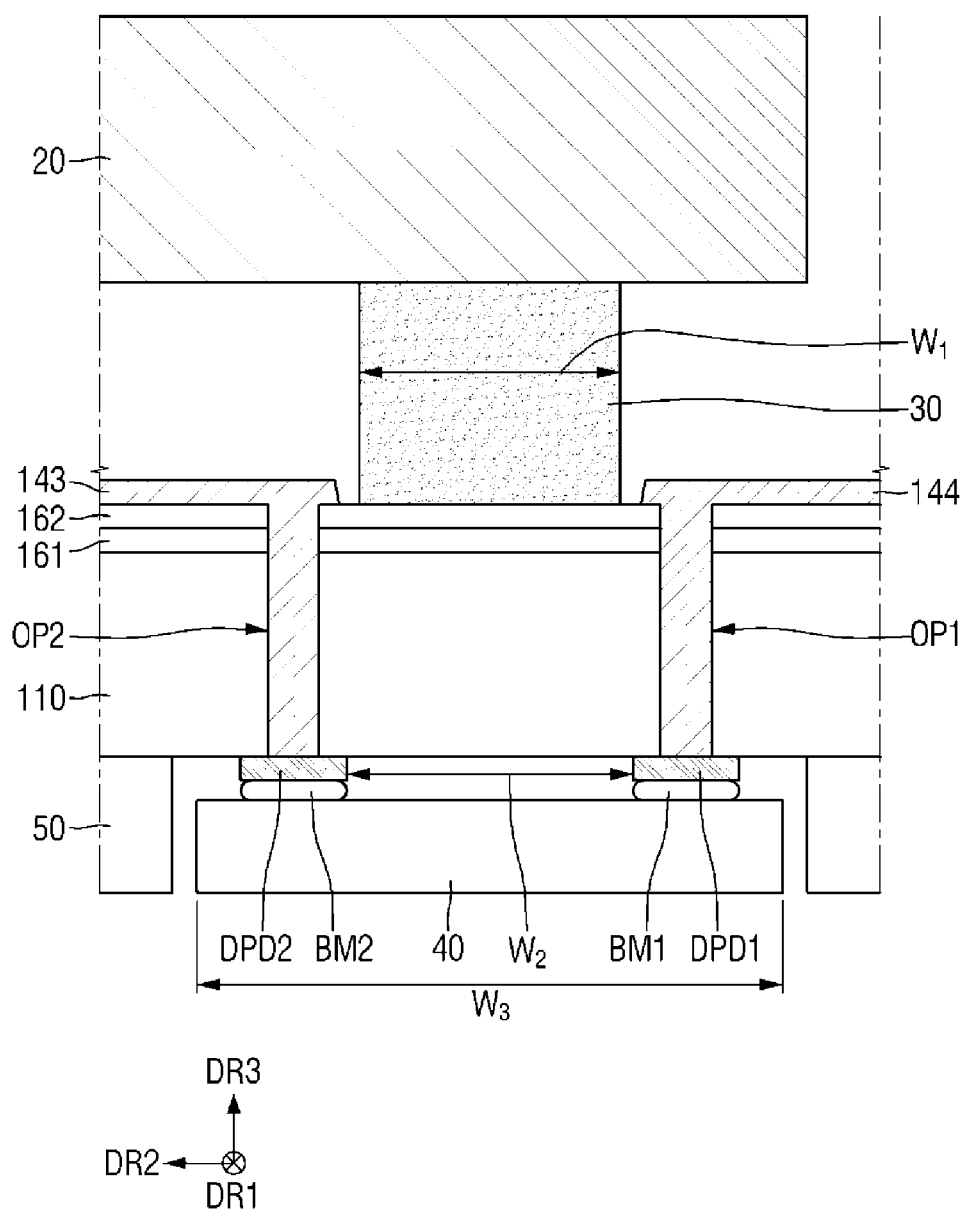
FIG. 10 is an enlarged view of an example of area B of FIG. 9.

FIG. 10 is an enlarged view of an example of area B of FIG. 9.

Referring to FIGS. 9 and 10, the display pads DPD1 and DPD2 and a plurality of bumps BM1 and BM2 may be disposed between the display driving circuit 40 and the base substrate 110. The bumps BM1 and BM2 may be disposed on the upper surface of the display driving circuit 40 which overlaps the display pads DPD1 and DPD2 in the third direction DR3.

The bumps BM1 and BM2 may electrically connect the display driving circuit 40 and the display pads DPD1 and DPD2. In an embodiment, the display driving circuit 40 may be mounted on the lower surface of the base substrate 110 in a COG (chip on glass) manner by using the bumps BM1 and BM2 so that it is electrically connected to the display pads DPD1 and DPD2 disposed on the lower surface of the base substrate 110.

The bumps BM1 and BM2 may include a first bump BM1 and a second bump BM2.

The first bump BM1 may be electrically connected to the first display pad DPD1, and the second bump BM2 may be electrically connected to the second display pad DPD2.

In an exemplary embodiment, the first bump BM1 may be an input bump which receives an external signal from the display driving circuit 40 and provides the external signal to the display driving circuit 40, and the second bump BM2 may be an output bump which supplies a data voltage converted by the display driving circuit 40 or a scan control signal to the display panel 10. However, the present disclosure is not limited thereto, and the first bump BM1 may also be an output bump, and the second bump BM2 may also be an input bump according to the display pad DP1 or DP2 connected to each bump BM1 or BM2 in another embodiment.

Referring to FIGS. 6 and 8 through 10, a plurality of first bumps BM1 may overlap a plurality of first display pads DPD1 disposed in the second pad part PDA2. The first bumps BM1 may be disposed to correspond one-to-one to the first display pads DPD1 disposed on the lower surface of the base substrate 110. The first bumps BM1 may be spaced apart from each other.

Upper surfaces of the first bumps BM1 may directly contact the lower surfaces of the first display pads DPD1. The first bumps BM1 may directly contact the first display pads DPD1 so as to be electrically connected to the first display pads DPD1.

The second bumps BM2 may overlap the second display pads DPD2 disposed in the third pad part PDA3. The second bumps BM2 may be formed to correspond one-to-one to the second display pads DPD2 disposed on the lower surface of the base substrate 110. The second bumps BM2 may be spaced apart from each other.

Upper surfaces of the second bumps BM2 may directly contact the lower surfaces of the second display pads DPD2. The second bumps BM2 may directly contact the second display pads DPD2 so as to be electrically connected to the second display pads DPD2.

The first bumps BM1 and the second bumps BM2 may be spaced apart from each other on the upper surface of the display driving circuit 40. An area between the first bumps BM1 and the second bumps BM2 in the second direction DR2 may overlap the sealing member 30. That is, the first bumps BM1 and the second bumps BM2 may be disposed not to overlap the sealing member 30.

The positional relationship between the sealing member 30, the display pads DPD1 and DPD2 and the display driving circuit 40 in the third direction DR3 and the relationship between a width $W_1$ of the sealing member 30, a width $W_2$ between a first display pad DPD1 and a second display pad DPD2, and a width $W_3$ of the display driving circuit 40 will now be described with reference to FIG. 10. The width $W_2$ between the first display pad DPD1 and the second display pad DPD2 is defined as a distance between respective side surfaces of the first display pad DPD1 and the second display pad DPD2 facing each other in the second direction DR2.

The display driving circuit 40 may overlap the first display pad DPD1, the second display pad DPD2, and the sealing member 30. The display driving circuit 40 may be disposed under the first display pad DPD1, the second display pad DPD2, and the sealing member 30 to completely cover the first display pad DPD1, the second display pad DPD2, and the sealing member 30.

Each of the first display pad DPD1 and the second display pad DPD2 may not overlap the sealing member 30 in the third direction DR3. The first display pad DPD1 and the second display pad DPD2 may be spaced apart from each other in the second direction DR2. The first display pad DPD1 and the second display pad DPD2 may be spaced apart from each other with an area overlapping the sealing member 30 interposed between them. Therefore, the width $W_2$ between the first display pad DPD1 and the second display pad DPD2 may be greater than or equal to the width $W_1$ of the sealing member 30. The width $W_3$ of the display driving circuit 40 may be greater than the width $W_2$ between the first display pad DPD1 and the second display pad DPD2. In addition, the width $W_3$ of the display driving circuit 40 may be greater than the width $W_1$ of the sealing member 30. In an exemplary embodiment, the width $W_3$ of the display driving circuit 40 may range from about 2.5 millimeters (mm) to about 3.5 mm, and the width $W_1$ of the sealing member 30 may range from about 1.7 mm to about 2.8 mm, but the present disclosure is not limited thereto.

Hereinafter, other embodiments will be described. In the following embodiments, a description of the same elements as those described above will be omitted or given briefly, and differences will be mainly described.

Figure 11:
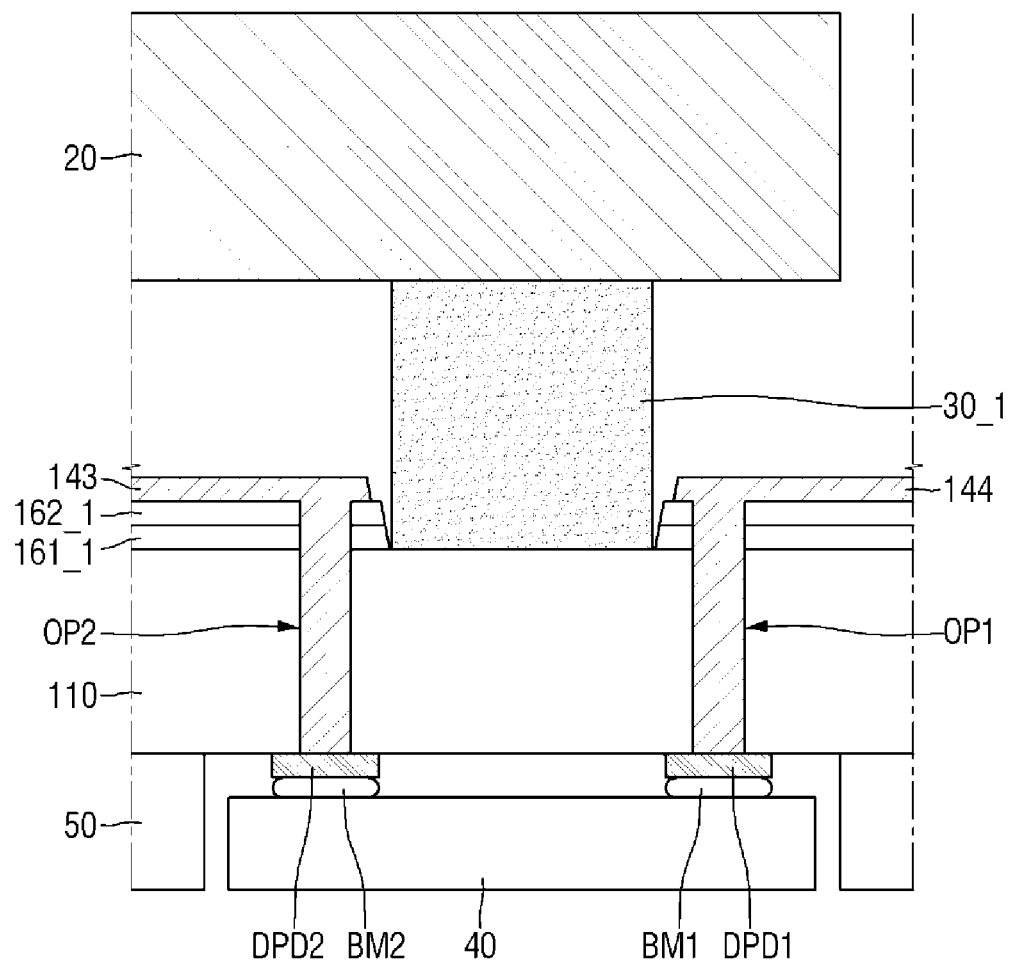
FIG. 11 is an enlarged view of another example of area B of FIG. 9.

FIG. 11 is an enlarged view of another example of area B of FIG. 9.

The embodiment of FIG. 11 is different from the embodiment of FIG. 10 in that a buffer layer 161_1 and a gate insulating layer 1621 disposed in a non-display area NDA do not overlap a sealing member 30_1.

Referring to FIG. 11, the buffer layer 161_1 and the gate insulating layer 162_1 disposed on an upper surface of a base substrate 110 in the non-display area NDA may not overlap the sealing member 30_1. The buffer layer 161_1 and the gate insulating layer 162_1 may expose, in the third direction DR3, the upper surface of the base substrate 110 disposed in an area overlapping the sealing member 30_1.

The buffer layer 161_1 and the gate insulating layer 162_1 disposed in the non-display area NDA may be disposed up to an area adjacent to the sealing member 30_1. In the area adjacent to the sealing member 30_1, side surfaces of the buffer layer 161_1 and the gate insulating layer 162_1 may be disposed to face side surfaces of the sealing member 30_1. Although the side surfaces of the buffer layer 1611 and the gate insulating layer 162_1 are spaced apart from the side surfaces of the sealing member 30_1 in the drawing, they may also be in contact with each other.

In the current embodiment, an upper surface of the sealing member 30_1 may directly contact the lower surface of an encapsulation substrate 20, and a lower surface of the sealing member 30_1 may directly contact the upper surface of the base substrate 110. When laser light is irradiated into the sealing member 30_1 by a laser to be described later, the encapsulation substrate 20 and the sealing member 30_1 may be bonded to contact each other, and the base substrate 110 and the sealing member 301 may be bonded to contact each other, thus increasing adhesion.

Figure 12:
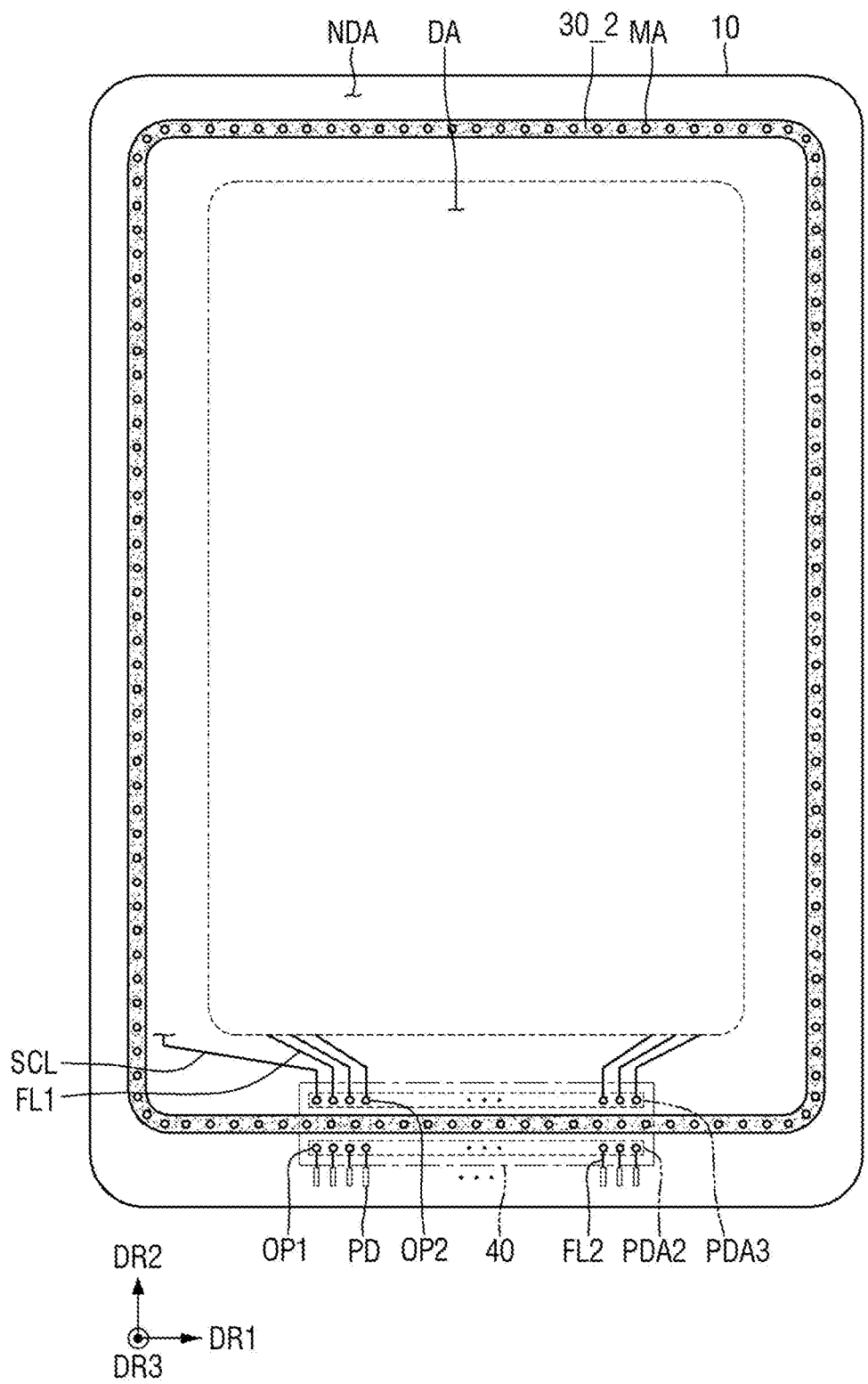
FIG. 12 is a layout view illustrating the relative positional relationship between a display panel and a sealing member of a display device according to an embodiment.
Figure 13:
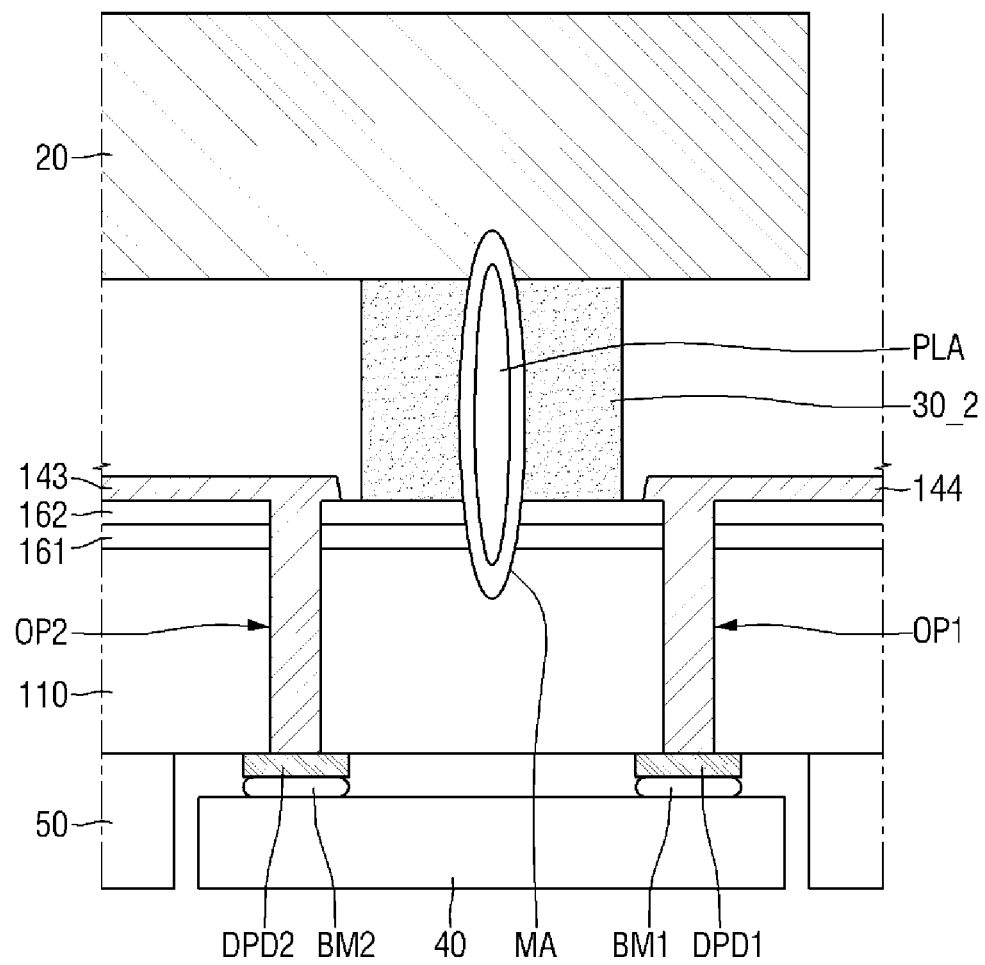
FIG. 13 is an enlarged cross-sectional view of an example of a non-display area of the display device of FIG. 12.

FIG. 12 is a layout view illustrating the relative positional relationship between a display panel 10 and a sealing member 30_2 of a display device 1 according to an embodiment. FIG. 13 is an enlarged cross-sectional view of an example of a non-display area NDA of the display device 1 of FIG. 12. FIG. 13 is a cross-sectional view of an area disposed at a lower edge of the non-display area NDA of the display device 1 of FIG. 12. FIG. 13 illustrates an area corresponding to the enlarged cross-sectional view of FIG. 10 described above.

Referring to FIGS. 12 and 13, the current embodiment is different from the embodiments of FIGS. 1 through 11 in that fusion areas MA are formed in the sealing member 30_2 of the display device 1 according to the current embodiment Referring to FIGS. 12 and 13, the display device 1 according to the current embodiment may further include the fusion areas MA where there is substantially no physical boundary between a base substrate 110 of the display panel 10, the sealing member 30_2 and an encapsulation substrate 20. The sealing member 30_2 may be partially fused and thus bonded to the base substrate 110 and the encapsulation substrate 20 in the fusion areas MA. The sealing member 30_2 according to the current embodiment may include an area where a physical interface exists between the base substrate 110 and the sealing member 30_2 and/or between the encapsulation substrate 20 and the sealing member 30_2 and an area where no physical interface exists between the base substrate 110 and the sealing member 30_2 and/or between the encapsulation substrate 20 and the sealing member 30_2. In the present specification, when a physical interface between two elements does not exist or does not substantially exist, it means that there is no physical interface that can physically separate the two elements.

Each of the fusion areas MA may roughly coincide with an area where heat is diffused under the influence of thermal energy generated by laser irradiation as will be described in a method of fabricating the display device 1 which will be described later. Each of the fusion areas MA may be an area formed as the base substrate 110, the encapsulation substrate 20 and the sealing member 30_2 are partially melted by heat and then solidified.

Since the fusion areas MA are formed as the base substrate 110, the encapsulation substrate 20 and the sealing member 30_2 are partially melted by heat and then solidified, a material that forms the sealing member 30_2 and a material that forms the base substrate 110 or the encapsulation substrate 20 may be mixed in the fusion areas MA. In the fusion areas MA, a portion of the material that forms the sealing member 302 may flow into the base substrate 110 and/or the encapsulation substrate 20 and then be mixed with the material that forms the base substrate 110 and/or the encapsulation substrate 20. In a part where each fusion area MA is formed, there may be no physical boundary between an upper surface of the sealing member 30_2 and a lower surface of the encapsulation substrate 20. In addition, since the fusion areas MA are formed as the materials that form the sealing member 30_2 and the encapsulation substrate 20 are mixed with each other, the adhesion between the sealing member 30_2 and the encapsulation substrate 20 may be improved. Likewise, in the part where each fusion area MA is formed, there may be no physical boundary between a lower surface of the sealing member 30_2 and an upper surface of the base substrate 110. In addition, since the fusion areas MA are formed as the materials that form the sealing member 30_2 and the base substrate 110 are mixed with each other, the adhesion between the sealing member 30_2 and the base substrate 110 may be improved.

The fusion areas MA may be formed along the sealing member 302 in a plan view. The fusion areas MA may be spaced apart from each other along the sealing member 30_2. In an exemplary embodiment, the fusion areas MA may be spaced apart from each other to form a pattern. Although the fusion areas MA having the shape of FIG. 13 are spaced apart from each other to form a pattern in FIG. 12, the present disclosure is not limited thereto. The fusion areas MA may also have a different shape in a plan view and may also be connected to each other to have a predetermined length instead of being spaced apart from each other or may have a closed loop shape along the sealing member 302 in another embodiment. Alternatively, the fusion areas MA may be formed along a widthwise direction of the sealing member 30_2 and may be spaced apart from each other.

Each of the fusion areas MA may be disposed across the base substrate 110, the sealing member 30_2, and the encapsulation substrate 20 by penetrating the sealing member 30_2. In the present specification, when an element is disposed across certain elements or located over certain elements, it means that the element is continuously disposed over a space provided by the certain elements. That is, each of the fusion areas MA may extend as a single piece from the base substrate 110 to the encapsulation substrate 20 via the sealing member 30_2 without being interrupted in the middle.

Each of the fusion areas MA may have an oval shape having a long axis in the third direction DR3 and a short axis in the second direction DR2. Each of the fusion areas MA may be variously modified in width and height according to a width W1 and height of the sealing member 30_2. According to an embodiment, the height of each of the fusion areas MA may be greater than a thickness of the sealing member 30_2 in the third direction DR3.

In some embodiments, the width $W_1$ of the sealing member 302 may range from about 1.8 mm to about 2.8 mm, and the height of the sealing member 302 may range from about 5 micrometers (μm) to about 7 μm. The width (or length in a short-axis direction) of each of the fusion areas MA may range from about 50 μm to about 200 μm, and the height (or length in a long-axis direction) of each of the fusion areas MA may range from about 100 μm to about 300 μm. However, the present disclosure is not limited thereto, and the width and height of each of the fusion areas MA may also vary according to the intensity of laser light irradiated during a process of fabricating the display device 1 in another embodiment.

The light transmittance, refractive index and/or density of each of the fusion areas MA may be different from the light transmittances, refractive indices and/or densities of the base substrate 110, the sealing member 30_2 and the encapsulation substrate 20. In addition, the material composition of each of the fusion areas MA may be different from the material compositions of the base substrate 110, the sealing member 30_2 and the encapsulation substrate 20. That is, denatured parts where optical characteristics such as light transmittance and refractive index and/or characteristics such as density and composition are changed, in other words, the fusion areas MA may be formed to penetrate the sealing member 30_2.

Specifically, a part that forms a contact surface where a physical boundary exists and a part where a physical boundary does not substantially exist are included between the base substrate 110 and the sealing member 30_2. The part where the physical boundary does not substantially exist may form a part of each fusion area MA. For example, in a lower end part of each fusion area MA, the material of the base substrate 110 and the material of the sealing member 30_2 may be at least partially mixed so that an interface between the base substrate 110 and the sealing member 302 can disappear. At least a portion of the material of the base substrate 110 may penetrate into the sealing member 30_2 and be melted and mixed with the material of the sealing member 30_2, or at least a portion of the material of the sealing member 30_2 may penetrate into the base substrate 110 and be melted and mixed with the material of the base substrate 110, but the present disclosure is not limited thereto.

Likewise, a part that forms a contact surface where a physical boundary exists and a part where a physical boundary does not substantially exist are included between the encapsulation substrate 20 and the sealing member 30_2. The part where the physical boundary does not substantially exist may form a part of each fusion area MA. For example, in an upper end part of each fusion area MA, the material of the encapsulation substrate 20 and the material of the sealing member 30_2 may be at least partially mixed so that an interface between the encapsulation substrate 20 and the sealing member 30_2 can disappear. At least a portion of the material of the encapsulation substrate 20 may penetrate into the sealing member 30_2 and be melted and mixed with the material of the sealing member 30_2, or at least a portion of the material of the sealing member 30_2 may penetrate into the encapsulation substrate 20 and be melted and mixed with the material of the encapsulation substrate 20, but the present disclosure is not limited thereto.

In some embodiments, a plasma structure PLA having a long axis and a short axis may be formed in each fusion area MA. The plasma structure PLA may be formed in a process of bonding the base substrate 110, the encapsulation substrate 20 and the sealing member 302, but the present disclosure is not limited thereto. The plasma structure PLA may have an oval shape having a long axis in the third direction DR3 and a short axis in the second direction DR2. The plasma structure PLA may be disposed across the base substrate 110, the sealing member 30_2, and the encapsulation substrate 20.

In some embodiments, the plasma structure PLA may be smaller in size than each fusion area MA. In an exemplary embodiment, when the width of each fusion area MA ranges from about 50 μm to about 200 μm and the height of each fusion area MA ranges from about 100 μm to about 300 μm, a width (or length in the short-axis direction) of the plasma structure PLA may range from about 10 μm to about 20 μm, and a height (or length in the long-axis direction) of the plasma structure PLA may range from about 50 μm to about 200 μm. However, the present disclosure is not limited thereto. In an embodiment, the size of the plasma structure PLA in each fusion area MA may vary. In an embodiment, the plasma structure PLA may not exist or may not be visible to the naked eye despite being present.

Figure 14:
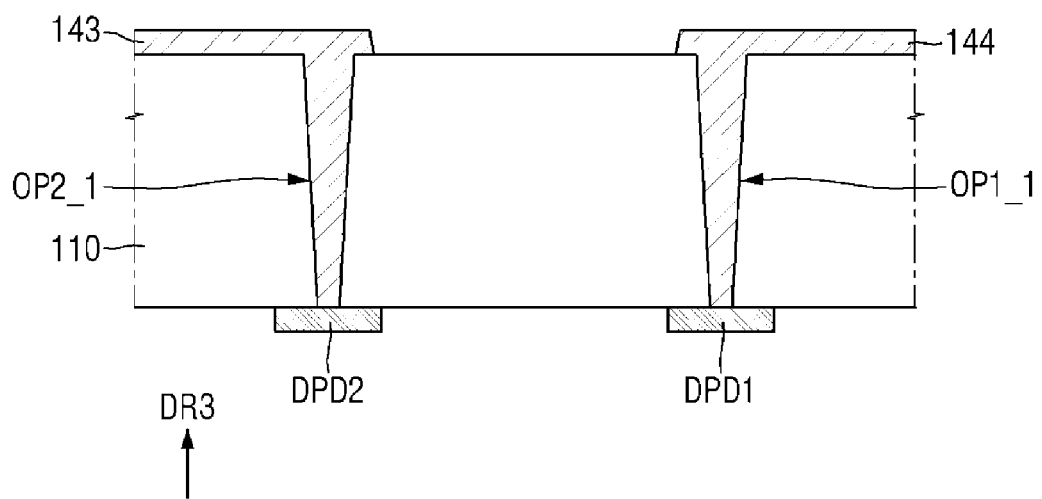
FIG. 14 is a cross-sectional view of an example of holes of a display panel.
Figure 15:
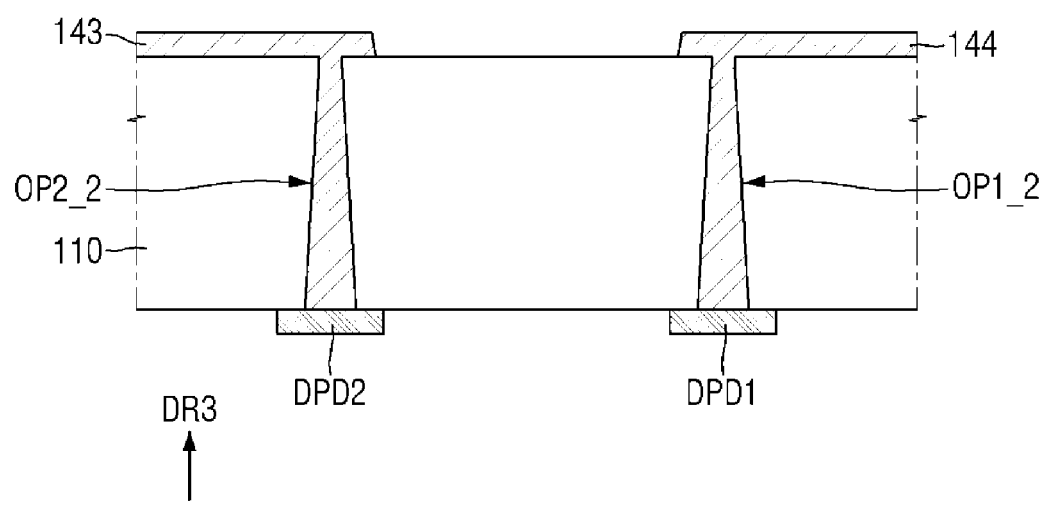
FIG. 15 is a cross-sectional view of another example of the holes of the display panel.
Figure 16:
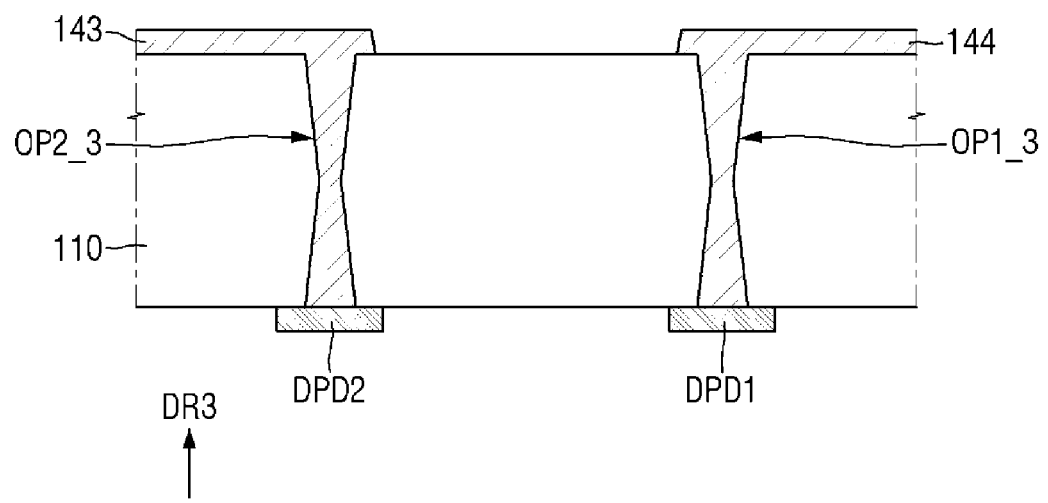
FIG. 16 is a cross-sectional view of still another example of the holes of the display panel.

FIG. 14 is a cross-sectional view of an example of holes of the display panel 10. FIG. 15 is a cross-sectional view of another example of the holes of the display panel 10. FIG. 16 is a cross-sectional view of still another example of the holes of the display panel 10.

In FIGS. 14 through 16, cross-sectional shapes of a plurality of through holes defined in the display panel 10 are different from those of FIG. 10.

Referring to FIG. 14, a first through hole OP1_1 and a second through hole OP2_1 defined to penetrate a base substrate 110 may have an inverted trapezoidal shape in cross section. Specifically, each of the through holes OP_1 and OP2_1 may be a shape of a truncated cone whose upper surface is wider than a lower surface. Sidewalls of each of the through holes OP_1 and OP2_1 may be inclined at a predetermined angle to a lower surface of the base substrate 110. The angles at which the sidewalls of each of the through holes OP1_1 and OP2_1 are inclined with respect to the lower surface of the base substrate 110 may be an acute angle. When laser light is irradiated from above the base substrate 110 to define each of the through holes OP1_1 and OP2_1 penetrating the base substrate 110, the through holes OP1_1 and OP2_1 having a truncated cone shape whose upper surface is wider than the lower surface may be defined as illustrated in FIG. 14.

Referring to FIG. 15, a first through hole OP_2 and a second through hole OP2_2 defined to penetrate a base substrate 110 may have a trapezoidal shape in cross section. Specifically, each of the through holes OP_2 and OP2_2 may have a shape of a truncated cone whose upper surface is narrower than a lower surface. Sidewalls of each of the through holes OP1_2 and OP2_2 may be inclined at a predetermined angle to a lower surface of the base substrate 110. The angles at which the sidewalls of each of the through holes OP1_2 and OP2_2 are inclined with respect to the lower surface of the base substrate 110 may bean obtuse angle. When laser light is irradiated from under the base substrate 110 to define each of the through holes OP1_2 and OP2_2 penetrating the base substrate 110, the through holes OP1_2 and OP2_2 having a truncated cone shape whose upper surface is narrower than the lower surface may be defined as illustrated in FIG. 15.

Referring to FIG. 16, each of a first through hole OP1_3 and a second through hole OP2_3 defined to penetrate a base substrate 110 may become wider from a reference line inside the base substrate 110 toward upper and lower surfaces of the base substrate 110. When laser light is irradiated from above and under the base substrate 110 to define the through holes OP1_3 and OP2_3 penetrating the base substrate 110, the through holes OP_3 and OP2_3 may be defined as illustrated in FIG. 16.

Figure 17:
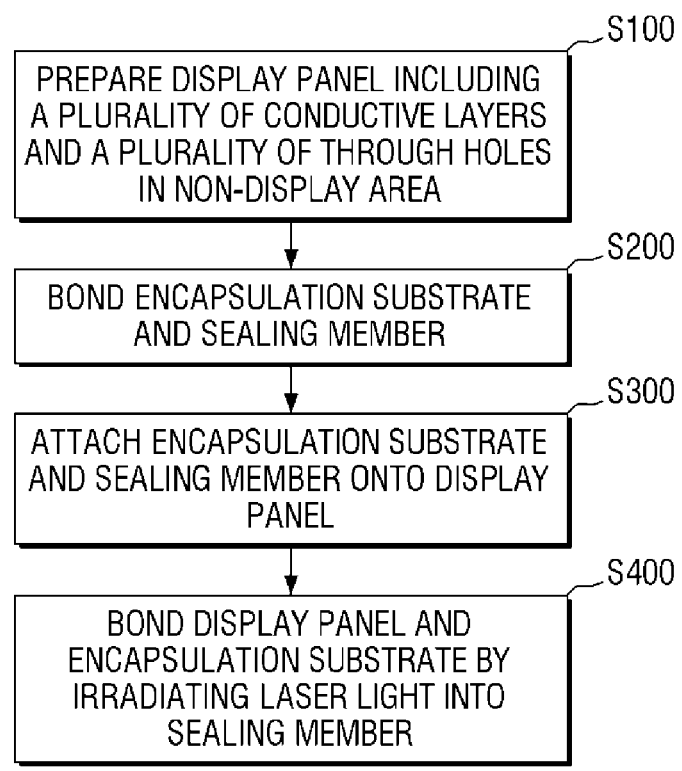
FIG. 17 is a flowchart illustrating a method of fabricating a display device according to an embodiment.

FIG. 17 is a flowchart illustrating a method of fabricating a display device 1 according to an embodiment Referring to FIG. 17, the method of fabricating the display device 1 according to the embodiment includes preparing a display panel including a plurality of conductive layers and a plurality of through holes in a non-display area (operation S100), bonding an encapsulation substrate and a sealing member (operation S200), attaching a structure, in which the sealing member is bonded onto the encapsulation substrate, onto the display panel (operation S300), and bonding the display panel and the encapsulation substrate by irradiating laser light into the sealing member (operation S400).

FIGS. 18 through 21 are cross-sectional views illustrating a process of fabricating a display device according to an embodiment.

The method of fabricating the display device 1 according to the embodiment will now be described in detail with reference to FIGS. 17 through 21. In FIGS. 18 through 21, only a non-display area NDA of the display device 1 is illustrated for ease of description.

First, a display panel including a plurality of conductive layers and a plurality of through holes in a non-display area is prepared (operation S100 of FIG. 17).

Figure 18:
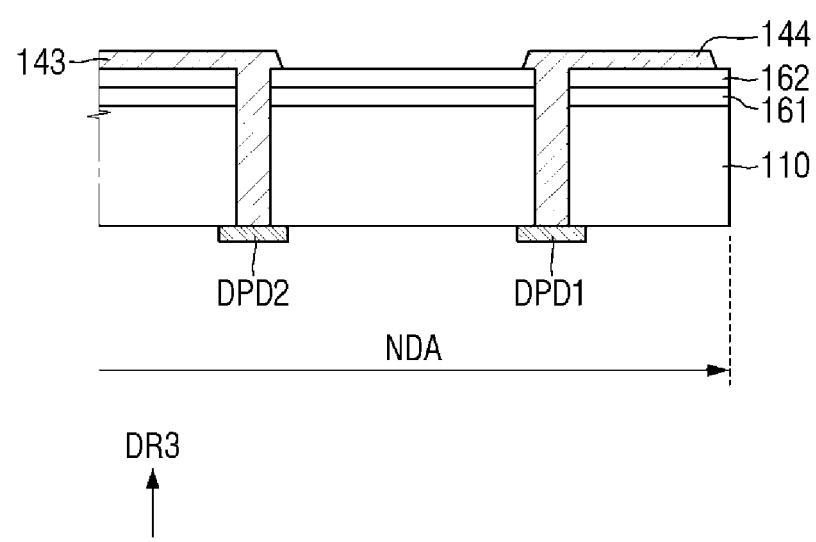
FIGS. 18 through 21 are cross-sectional views illustrating a process of fabricating a display device according to an embodiment.

Referring to FIGS. 9, 17 and 18, a display panel 10 may include a base substrate 110, a buffer layer 161, a gate insulating layer 162, and a plurality of conductive layers 143, 144, DPD1 and DPD2 in the non-display area NDA. The buffer layer 161 may be disposed on an upper surface of the base substrate 110, and the gate insulating layer 162 may be disposed on an upper surface of the buffer layer 161. The conductive layers 143, 144, DPD1 and DPD2 may include a first signal line 143 and a second signal line 144 disposed on the upper surface of the base substrate 110 and a first display pad DPD1 and a second display pad DPD2 disposed on a lower surface of the base substrate 110. The first signal line 143 and the second signal line 144 may respectively contact the second display pad DPD2 and the first display pad DPD1 through through-holes penetrating the base substrate 110, the buffer layer 161 and the gate insulating layer 162. The through holes penetrating the base substrate 110, the buffer layer 161 and the gate insulating layer 162 may be defined by a laser or the like.

Next, a structure in which an encapsulation substrate and a sealing member are bonded together is prepared by placing the sealing member on the encapsulation substrate (operation S200 of FIG. 17).

Figure 19:
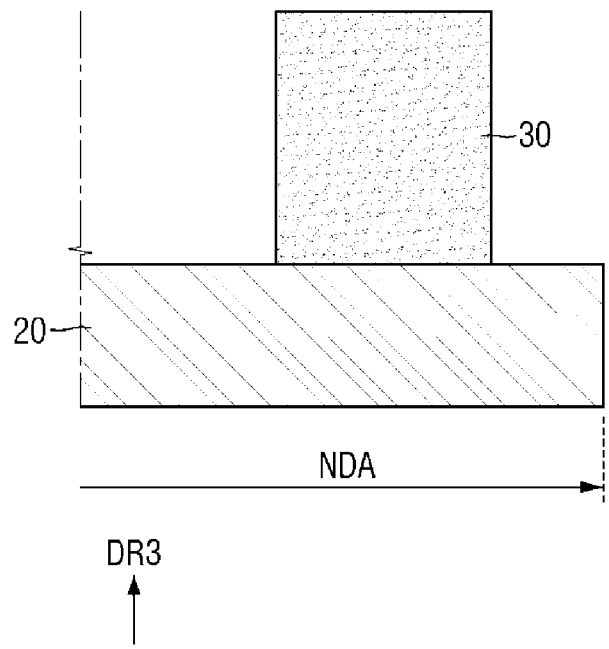

Referring to FIGS. 17 and 19, a sealing member 30 may be formed on an encapsulation substrate 20. Specifically, frit crystals may be prepared on the non-display area NDA of the encapsulation substrate 20, that is, outside a display area DA Then, printing, drying and baking processes may be performed to form a structure in which the sealing member 30 is disposed on the encapsulation substrate 20. In the above processes, the encapsulation substrate 20 and the sealing member 30 may be at least partially physically bonded to each other. In some embodiments, the frit crystals may be glass in powder form optionally added with an additive. As described above, the sealing member 30 may include frit, and frit crystals may be melted and cured to form a structure having glass properties, thereby forming a structure in which the encapsulation substrate 20 and the sealing member 30 are bonded together.

Next, the structure in which the sealing member is bonded onto the encapsulation substrate is attached onto the display panel (operation S300 of FIG. 17).

Figure 20:
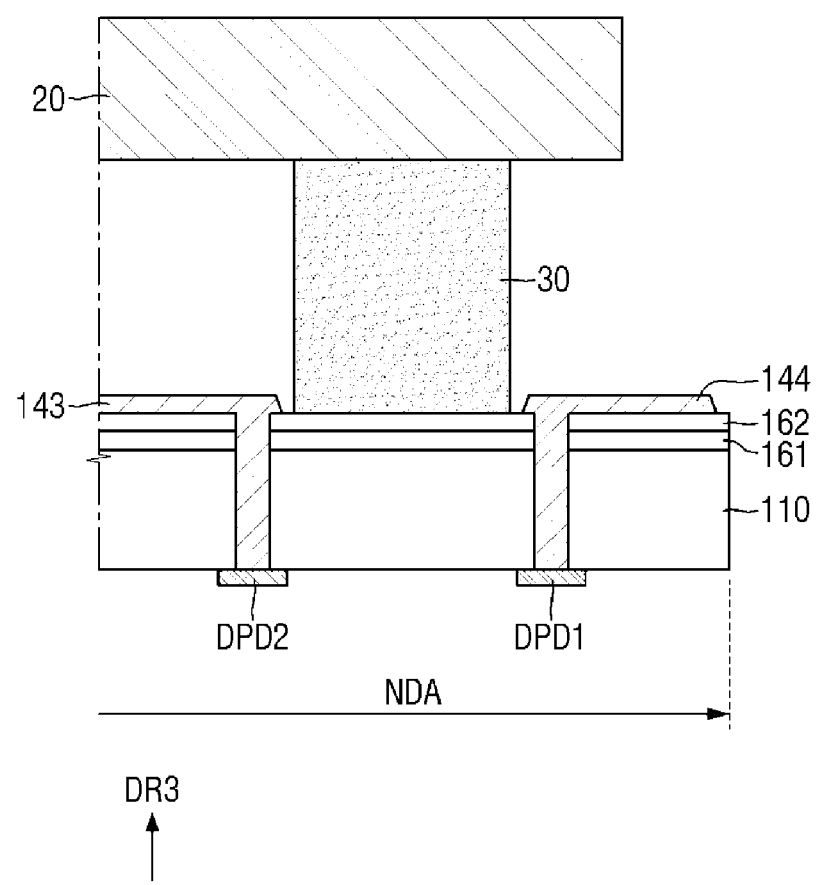

Referring to FIGS. 17 and 20, the structure in which the encapsulation substrate 20 and the sealing member 30 are bonded together may be placed on the display panel 10 such that the sealing member 30 is disposed between the base substrate 110 of the display panel 10 and the encapsulation substrate 20. The sealing member 30 may be placed on the non-display area NDA of the display panel 10 not to overlap the conductive layers 143, 144, DPD1 and DPD2. As described above, the sealing member 30 may be placed to overlap an area between the first signal line 143 and the second signal line 144 in the third direction DR3. Likewise, the sealing member 30 may be placed to overlap an area between the first display pad DPD1 and the second display pad DPD2 in the third direction DR3.

The structure in which the encapsulation substrate 20 and the sealing member 30 are bonded together may be closely attached onto the display panel 10. Specifically, a lower surface of the sealing member 30 may be closely attached onto the base substrate 110. The structure may be closely attached onto the display panel 10 by applying pressure to the encapsulation substrate 20. However, the method of closely attaching the structure is not limited thereto.

Next, the display panel and the encapsulation substrate are bonded together by irradiating laser light into the sealing member (operation S400 of FIG. 17).

Figure 21:
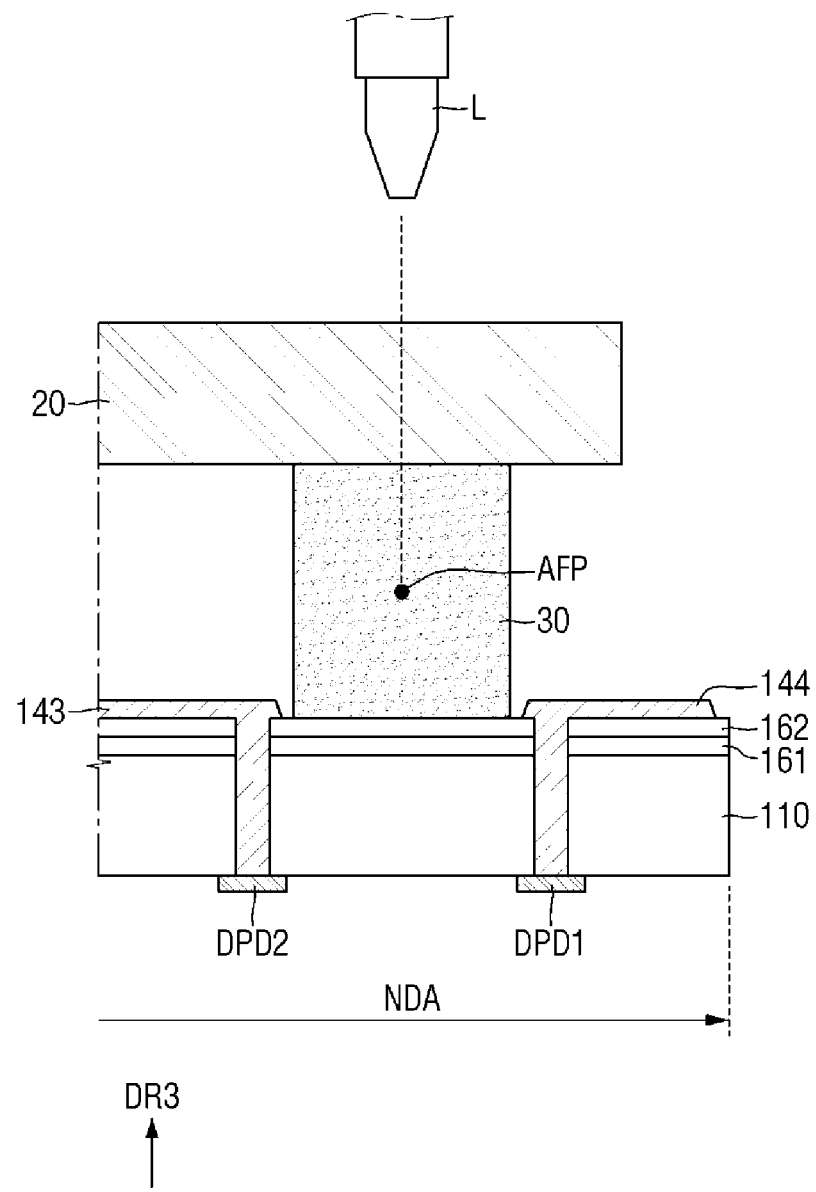

Referring to FIGS. 13, 17 and 21, a laser L is placed above the encapsulation substrate 20, and a focus AFP is formed. The focus AFP of the laser L may be formed inside the sealing member 30.

However, the present disclosure is not limited thereto, and the laser L may also be placed under the display panel 10 to irradiate light beam from under the display panel 10 to the focus AFP formed inside the sealing member 30. When the laser L is placed under the display panel 10, it may irradiate light from an area overlapping the sealing member 30 in the third direction DR3 so that the light travels in the third direction DR3 to the focus AFP formed inside the sealing member 30. This is to prevent the light irradiated by the laser L from reaching the conductive layers 143, 144, DPD1 and DPD2 disposed in the non-display area NDA of the display panel 10.

In an exemplary embodiment, the laser L may be a pulsed laser. Pulsed lasers may have a greater temporal focus of energy than continuous wave lasers. A pulsed laser, for example, a laser having a short pulse width may cause a nonlinear absorption phenomenon in a transparent medium due to its high output power. This may localize energy transfer, thereby minimizing changes in physical/chemical properties of the transparent medium. For example, the laser L may be a microwave laser having a pulse width of 10 to 50 femtoseconds.

Next, the laser beam from laser L may be irradiated from above the encapsulation substrate 20 to sequentially transmit through the encapsulation substrate 20 and the sealing member 30. The laser beam may be irradiated to the focus AFP formed inside the sealing member 30. The encapsulation substrate 20 may include a transparent material, and the laser beam may pass through the encapsulation substrate 20 to reach the inside of the sealing member 30.

As described above, the laser L may be a microwave laser that may induce the nonlinear absorption phenomenon. When the focus APF is formed inside the sealing member 30, and then the laser beam from laser L is irradiated, intensive energy may be transmitted to around the focus AFP and thus converted into, for example, thermal energy. On the other hand, although the laser beam transmits through the encapsulation substrate 20, the sealing member 30 and the base substrate 110, there may be substantially no change in physical/chemical properties such as light transmittance, refractive index, density and/or material composition in other parts of the encapsulation substrate 20, the sealing member 30 and the base substrate 110 excluding a fusion area MA (see FIG. 13) intended by the nonlinear absorption phenomenon.

The thermal energy generated by the laser beam may partially melt the base substrate 110, the sealing member 30 and the encapsulation substrate 20 and may form the fusion area MA (see FIG. 13) having substantially no physical boundary between the base substrate 110, the sealing member 30 and the encapsulation substrate 20. For example, the diffusion of the thermal energy may locally raise the temperature of a laminate of the base substrate 110, the sealing member 30 and the encapsulation substrate 20, and the base substrate 110, the sealing member 30 and the encapsulation substrate 20 may be fused and bonded to each other. The fusion area MA does not have a physical interface with a part adjacent to each of base substrate 110, the sealing member 30, and the encapsulation substrate 20. However, there may be traces visible enough to the naked eye due to a difference in material composition or the like between the base substrate 110, the sealing member 30 and the encapsulation substrate 20. The fusion area MA may be disposed across the base substrate 110, the sealing member 30, and the encapsulation substrate.

In addition, a plasma structure PLA (see FIG. 13) may be formed in the fusion area MA by the irradiation of the laser beam irradiated the laser L. The plasma structure PLA may have a long axis and a short axis. The plasma structure PLA may grow from the position of the focus AFP of the laser L described above toward the base substrate 110 and the encapsulation substrate 20.

In the current embodiment, when the conductive layers (for example 143, 144, DPD1 and DPD2) disposed on the non-display area NDA of the base substrate 110 are placed not to overlap the sealing member 30, the focus AFP to which the laser beam is irradiated can be formed inside the sealing member 30. When laser light is irradiated to the focus AFP formed inside the sealing member 30, thermal energy may be transferred from the focus AFP disposed inside the sealing member 30 to the base substrate 110 in which the fusion area MA is formed. Since the conductive layers (143, 144, DPD1 and DPD2) disposed on the non-display area NDA of the base substrate 110 are placed not to overlap the sealing member 30, even when the thermal energy is transferred to a part of the base substrate 110 overlapping the sealing member 30, the conductive layers (143, 144, DPD1 and DPD2) disposed on the base substrate 110 can be prevented from being damaged by the thermal energy.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
   a display panel which comprises a display area comprising pixels and a non-display area surrounding the display area;
   an encapsulation substrate which faces the display panel and is disposed on a surface of the display panel; and
   a sealing member disposed in the non-display area and interposed between the display panel and the encapsulation substrate to bond the display panel and the encapsulation substrate together,
   wherein:
   the display panel comprises a base substrate and a first conductive layer disposed on a first surface of the base substrate,
   the base substrate provides a through hole defined in at least a part of the non-display area to penetrate the base substrate in a thickness direction,
   the first conductive layer comprises a signal line disposed in at least a part of the display area and non-display area and in contact with an interlayer insulting film of the display area, and the signal line filling the through hole, and
   the sealing member does not overlap the first conductive layer and the through hole in the thickness direction.

2. The display device of claim 1, wherein a fusion area in which no physical boundary exists between the base substrate, the encapsulation substrate and the sealing member is disposed in the non-display area, and the fusion area is disposed across the base substrate, the sealing member and the encapsulation substrate.

3. The display device of claim 2, wherein a contact surface between the base substrate and the sealing member partially has a physical boundary, and a contact surface between the encapsulation substrate and the sealing member partially has a physical boundary.

4. The display device of claim 2, wherein the fusion area does not overlap the signal line.

5. The display device of claim 2, wherein a height of the fusion area is greater than a thickness of the sealing member in the thickness direction.

6. The display device of claim 2, wherein a plasma structure having a long axis and a short axis is included in the fusion area, and the plasma structure is disposed across the base substrate, the sealing member and the encapsulation substrate.

7. The display device of claim 6, wherein the plasma structure does not overlap the signal line.

8. The display device of claim 1, further comprising a display driving circuit disposed on a second surface opposite to the first surface of the base substrate to overlap the sealing member in the thickness direction.

9. The display device of claim 8, wherein the display panel further comprises a second conductive layer disposed between the base substrate and the display driving circuit and which does not overlap the sealing member in the thickness direction, and the second conductive layer comprises a display pad overlapping the through hole in the thickness direction.

10. The display device of claim 9, wherein the display driving circuit is electrically connected to the signal line through the through hole and the display pad.

11. The display device of claim 8, further comprising a display circuit board disposed in the non-display area and disposed on the first surface of the base substrate.

12. The display device of claim 11, wherein the signal line comprises a first signal line electrically connecting the display driving circuit and the pixels of the display panel and a second signal line electrically connecting the display driving circuit and the display circuit board.

13. The display device of claim 8, wherein a width of the sealing member is smaller than a width of the display driving circuit.

14. A display device comprising:
- a first substrate which comprises a plurality of light emitting elements, a base substrate comprising a display area having the light emitting elements and a non-display area surrounding the display area, a first conductive layer disposed on a first surface of the non-display area of the base substrate, and a second conductive layer disposed on a second surface opposite to the first surface of the non-display area of the base substrate;
- a second substrate disposed on a first surface of the first substrate;
- a sealing member disposed between the first substrate and the second substrate, disposed in the non-display area with a closed loop shape to surround the display area, and disposed not to overlap the first conductive layer and the second conductive layer in a thickness direction; and
- a display driving circuit which is disposed on a second surface opposite to the first surface of the first substrate and covers the second conductive layer and the sealing member, wherein:
- a first through hole which penetrates the base substrate in the thickness direction is defined in the non-display area of the base substrate inside an area outlined by the sealing member,
- a second through hole which penetrates the base substrate in the thickness direction is defined outside the area outlined by the sealing member,
- the second conductive layer comprises a first display pad overlapping the first through hole and a second display pad overlapping the second through hole, and
- the first conductive layer comprises a first signal line electrically connected to the first display pad through the first through hole and a second signal line electrically connected to the second display pad through the second through hole.

15. The display device of claim 14, wherein the display driving circuit is electrically connected to the first signal line through the first display pad and electrically connected to the second signal line through the second display pad.

16. The display device of claim 15, wherein a width of the display driving circuit is greater than a width of the sealing member, and
- a distance between the first display pad and the second display pad is greater than the width of the sealing member.

17. The display device of claim 14, wherein a fusion area in which no physical boundary exists between the first substrate, the second substrate and the sealing member is disposed in the non-display area, and the fusion area is disposed across the first substrate, the sealing member and the second substrate.

18. The display device of claim 17, wherein the fusion area does not overlap the first signal line, the second signal line, the first display pad, and the second display pad.

* * * * *